United States Patent
Choi et al.

(10) Patent No.: US 10,714,648 B2
(45) Date of Patent: Jul. 14, 2020

(54) SOLAR CELL WITH GRAPHENE-SILICON QUANTUM DOT HYBRID STRUCTURE AND METHOD OF MANUFACTURING THE SAME

(71) Applicant: UNIVERSITY-INDUSTRY COOPERATION GROUP OF KYUNG HEE UNIVERSITY, Yongin-si, Gyeonggi-do (KR)

(72) Inventors: Suk Ho Choi, Suwon-si (KR); Sung Kim, Suwon-si (KR); Jong Min Kim, Daejeon (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 323 days.

(21) Appl. No.: 15/415,311

(22) Filed: Jan. 25, 2017

(65) Prior Publication Data
US 2017/0213931 A1    Jul. 27, 2017

(30) Foreign Application Priority Data

Jan. 25, 2016 (KR) .................. 10-2016-0008751
Jan. 6, 2017 (KR) .................. 10-2017-0002159

(51) Int. Cl.
*H01L 31/0224* (2006.01)
*H01L 31/0384* (2006.01)
(Continued)

(52) U.S. Cl.
CPC .... *H01L 31/074* (2013.01); *H01L 31/022425* (2013.01); *H01L 31/022466* (2013.01);
(Continued)

(58) Field of Classification Search
CPC ............. H01L 31/0384; H01L 31/048; H01L 31/0481; B82Y 30/00; B82Y 40/00
See application file for complete search history.

(56) References Cited

U.S. PATENT DOCUMENTS 8,664,642 B1 * 3/2014 Davis ...................... H01L 29/41
257/29
2011/0030991 A1 * 2/2011 Veerasamy ............. C30B 29/02
174/126.1
(Continued)

FOREIGN PATENT DOCUMENTS

CN          103489939 A      1/2014
KR     10-2009-0103114 A    10/2009
(Continued)

OTHER PUBLICATIONS

Communication dated Oct. 24, 2017, issued by the Korean Patent Office in counterpart Korean Patent Application No. 10-2017-0002159.
(Continued)

*Primary Examiner* — Susan D Leong
(74) *Attorney, Agent, or Firm* — Sughrue Mion, PLLC

(57) ABSTRACT

Disclosed are a solar cell and a method of manufacturing the same. The solar cell with a graphene-silicon quantum dot hybrid structure according to an embodiment of the present disclosure includes a hybrid structure including a silicon quantum dot layer, in which a silicon oxide layer includes a plurality of silicon quantum dots; a doped graphene layer formed on the silicon quantum dot layer, and an encapsulation layer formed on the doped graphene layer; and electrodes formed on upper and lower parts of the hybrid structure.

4 Claims, 21 Drawing Sheets

(51) Int. Cl.
*H01L 31/048* (2014.01)
*B82Y 30/00* (2011.01)
*H01L 31/074* (2012.01)
*H01L 31/18* (2006.01)
*B82Y 40/00* (2011.01)

(52) U.S. Cl.
CPC ........ *H01L 31/0384* (2013.01); *H01L 31/048* (2013.01); *H01L 31/18* (2013.01); *H01L 31/1804* (2013.01); *H01L 31/1864* (2013.01); *B82Y 30/00* (2013.01); *B82Y 40/00* (2013.01); *Y02E 10/50* (2013.01)

(56) References Cited

U.S. PATENT DOCUMENTS

| | | | | |
|---|---|---|---|---|
| 2013/0000727 | A1* | 1/2013 | Iwata | H01L 31/06 136/261 |
| 2013/0025662 | A1* | 1/2013 | Afzali-Ardakani | H01B 1/04 136/256 |
| 2013/0048339 | A1* | 2/2013 | Tour | H01B 1/04 174/126.1 |
| 2018/0158913 | A1* | 6/2018 | Withers | H01L 29/267 |

FOREIGN PATENT DOCUMENTS

| | | |
|---|---|---|
| KR | 10-2012-0121113 A | 11/2012 |
| KR | 10-1257492 B1 | 4/2013 |
| KR | 10-2013-0050170 A | 5/2013 |
| KR | 10-2014-0040919 A | 4/2014 |
| KR | 10-2014-0105668 A | 9/2014 |
| KR | 10-1558801 B | 10/2015 |

OTHER PUBLICATIONS

Communication dated Nov. 21, 2018, issued by the Korean Patent Office in counterpart Korean Patent Application No. 10-2017-0002159.

Extended European Search Report issued by the European Patent Office dated Jun. 28, 2017 in corresponding European Patent Application No. 17153042.1.

Arefinia et al., "A new graphene-on-silicon solar cells by introducing an interlayer of silicon quantum dots," 23rd Iranian Conference on Electrical Engineering, May 2015, pp. 1415-1418.

Communication dated May 23, 2018, issued by the Korean Patent Office in counterpart Korean Patent Application No. 10-2017-0002150.

* cited by examiner

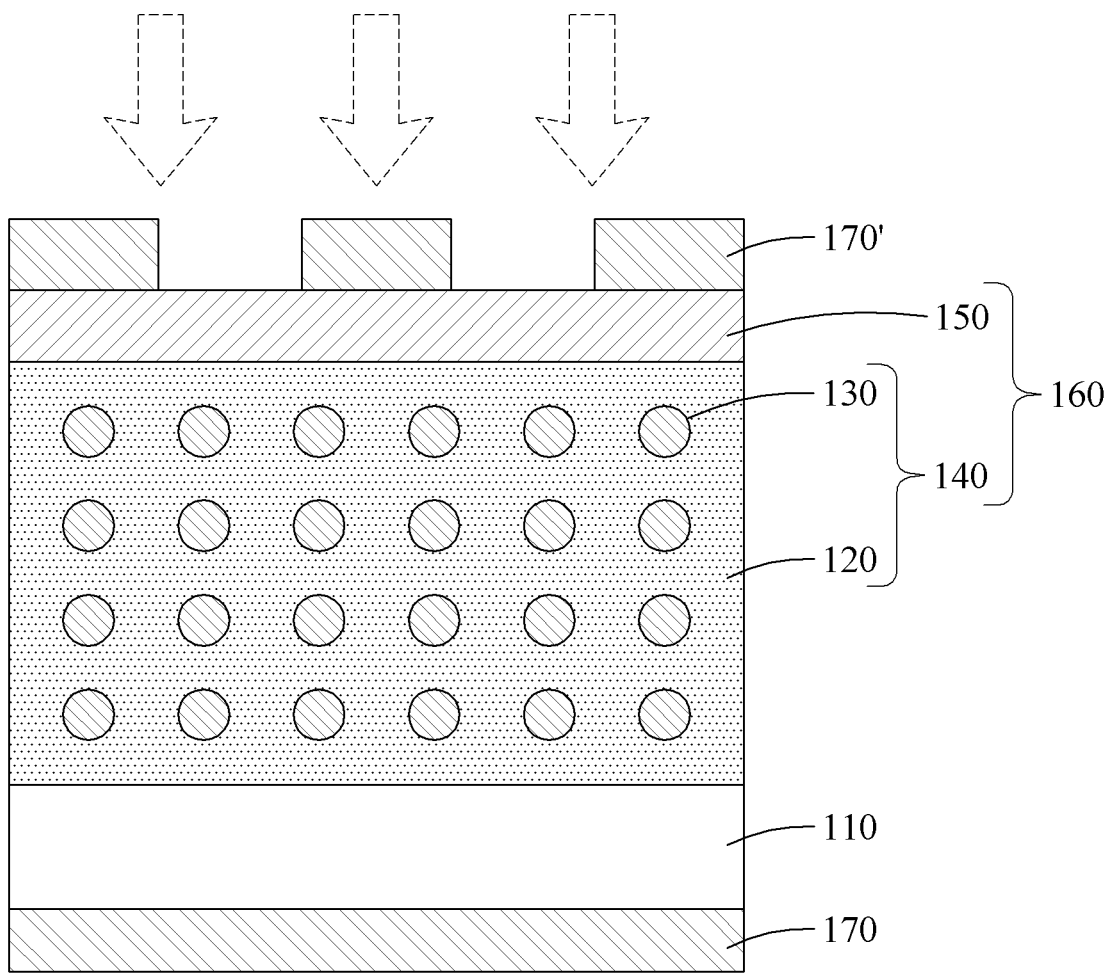

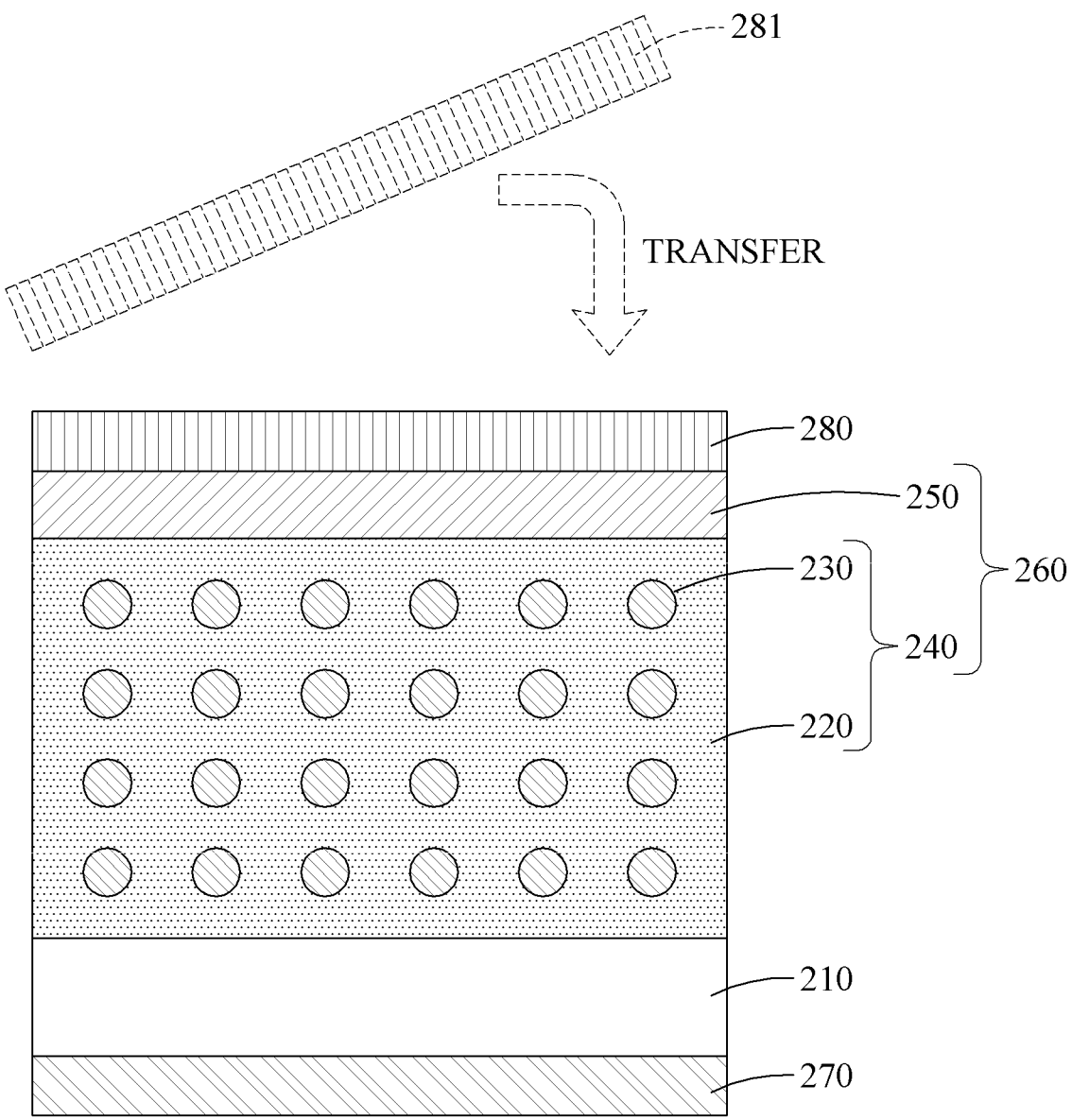

SOLAR CELL WITH GRAPHENE-SILICON QUANTUM DOT HYBRID STRUCTURE AND METHOD OF MANUFACTURING THE SAME

CROSS-REFERENCE TO RELATED APPLICATION

This application claims the priority benefit of Korean Patent Application No. 10-2016-0008751, filed on Jan. 25, 2016, and Korean Patent Application No. 10-2017-0002159, filed on Jan. 6, 2017, in the Korean Intellectual Property Office, the disclosure of which is incorporated herein by reference.

BACKGROUND OF THE DISCLOSURE

Field of the Disclosure

The present disclosure relates to a solar cell and a method of manufacturing the same.

Description of the Related Art

Graphene, a two-dimensional carbon nanomaterial, has low sheet resistance, high electrical conductivity, high transmittance, and high mechanical strength, and thus has been increasingly utilized in next-generation displays, such as flexible displays and touch panels, in the energy industry, such as solar cells, and in various electronics such as smart windows and RFID.

In recent years, graphene has attracted considerable attention due to potential thereof for the growth of industrial technology as well as the development of basic science. In particular, a technique of manufacturing large-area graphene was recently developed, whereby application possibility thereof is increasing.

Among large-area graphene products, graphene manufactured by chemical vapor deposition (CVD), which is widely used in the industry, has a large area and high transmittance and electrical conductivity, thereby being expected to be applied as a transparent electrode. Displays, transistors and solar cells based on graphene produced by chemical vapor deposition have also been developed.

Recently, the possibility of manufacture of solar cells through fusion and convergence of graphene and bulk silicon has been suggested. However, since bulk silicon cannot control bandgap energy, there have been problems in achieving ideal device performance through combination with graphene. Accordingly, if the bandgap energy of silicon can be controlled and the electrical properties of graphene can be controlled, an excellent and ideal solar cell can be manufactured.

Unlike bulk silicon, bandgap of silicon quantum dots can be controlled by controlling the sizes of the quantum dots due to the quantum confinement effect (QCE) thereof.

In particular, silicon quantum dots can be protected in air by forming the silicon quantum dots inside silicon dioxide ($SiO_2$) and, upon bonding with graphene, the contact characteristics of the silicon quantum dots can be improved. Accordingly, solar cell efficiency can be improve.

Meanwhile, a metal, such as gold or aluminum, has been used as a raw material of an electrode of a silicon quantum dot solar cell, whereby such an opaque metal electrode blocks a portion of sunlight. In addition, since such a metal electrode has a mesh structure, great loss occurs in trapping charge carriers generated by sunlight, whereby there is limitation in increasing efficiency.

To overcome these problems, a transparent electrode, such as an indium tin oxide (ITO) electrode, can be used. However, such a transparent electrode is expensive and it is difficult to control the optical and electrical characteristics thereof, whereby it is very difficult to maximize the efficiency of a solar cell.

On the other hand, graphene has excellent electrical conductivity, and excellent transmittance compared to metals and other transparent electrode materials. In addition, since graphene has a high work function, contact properties with silicon quantum dots can be improved. Further, since the work function can be controlled by doping with graphene, efficiency can be maximized when graphene is combined with a solar cell.

RELATED DOCUMENTS

Patent Documents

Korean Patent Laid-Open No. 10-2012-0121113 (published on Nov. 5, 2012, METHOD OF MANUFACTURING SOLAR CELL)

Korean Patent No. 10-1257492 (published on Apr. 17, 2013, SILICON QUANTUM DOT SOLAR CELL USING DOPING WITH SB OR INP AND METHOD OF MANUFACTURING THE SAME)

SUMMARY OF THE DISCLOSURE

Therefore, the present disclosure has been made in view of the above problems, and it is one object of the present disclosure to provide a solar cell with a hybrid structure including a silicon quantum dot layer and a doped graphene layer, and a method of manufacturing the same.

It is another object of the present disclosure to provide a solar cell with a graphene-silicon quantum dot hybrid structure having improved electrical characteristics due to control of a doping concentration of graphene, and a method of manufacturing the same.

It is another object of the present disclosure to provide a solar cell with a graphene-silicon quantum dot hybrid structure having increased stability and energy conversion efficiency through annealing, and a method of manufacturing the same.

It is another object of the present disclosure to provide a solar cell with a hybrid structure including a silicon quantum dot layer, a doped graphene layer, and an encapsulation layer, and a method of manufacturing the same.

It is yet another object of the present disclosure to provide a solar cell with a hybrid structure including a silicon quantum dot layer, a graphene layer, and a metal nanowire layer, and a method of manufacturing the same.

In accordance with an aspect of the present disclosure, the above and other objects can be accomplished by the provision of a solar cell with a graphene-silicon quantum dot hybrid structure, including: a hybrid structure including a silicon quantum dot layer, in which a silicon oxide layer includes a plurality of silicon quantum dots; a doped graphene layer formed on the silicon quantum dot layer, and an encapsulation layer formed on the doped graphene layer and encapsulating the doped graphene layer; and electrodes formed on upper and lower parts of the hybrid structure.

The encapsulation layer may be formed of graphene.

The hybrid structure and the electrode may be subjected to annealing.

The annealing may be performed at 450° C. to 550° C.

The doped graphene layer may be doped with any one dopant selected from the group consisting of $AuCl_3$, B, $HNO_3$ and $RhCl_3$.

The doped graphene layer may have a sheet resistance of 150 ohm/sq to 500 ohm/sq. In accordance with another aspect of the present disclosure, there is provided a solar cell with a graphene-silicon quantum dot hybrid structure, including: a hybrid structure including a silicon quantum dot layer, in which a silicon oxide layer includes a plurality of silicon quantum dots; a graphene layer on the silicon quantum dot layer; and a metal nanowire layer formed on the graphene layer; and electrodes formed on upper and lower parts of the hybrid structure.

The metal nanowire layer may be formed of silver nanowires.

In accordance with another aspect of the present disclosure, there is provided a method of manufacturing a solar cell with a graphene-silicon quantum dot hybrid structure, the method including: forming silicon quantum dot layer, in which the silicon oxide layer includes the plurality of silicon quantum dots, on a substrate; forming a doped graphene layer on the silicon quantum dot layer; forming an encapsulation layer on the doped graphene layer to complete a hybrid structure; and forming electrodes on upper and lower parts of the hybrid structure.

The forming of the encapsulation layer may include forming a conductive thin film on the substrate; and transferring the conductive thin film onto the doped graphene layer to form an encapsulation layer.

The forming of the silicon quantum dot layer may include manufacturing a multi-layered sample by alternately laminating a silicon oxide ($SiO_2$) thin film and a boron (B)-doped silicon suboxide ($SiO_x$) thin film on the substrate; and forming the silicon quantum dot layer, in which the silicon quantum dots are uniformly distributed in the silicon oxide layer, by annealing the multi-layered sample.

The forming of the doped graphene layer may include: forming a graphene thin film on a catalyst layer by reacting a carbon-containing mixed gas with the catalyst layer; forming a graphene layer by transferring the graphene thin film onto the silicon quantum dot layer, followed by annealing; and forming the doped graphene layer by spin-coating a solution including $AuCl_3$ on the graphene layer, followed by annealing.

The method may further include, after the forming of the electrodes, annealing the hybrid structure, on the upper and lower parts of which the electrodes are formed.

The annealing may be performed at 450° C. to 550° C.

In accordance with yet another aspect of the present disclosure, there is provided a method of manufacturing a solar cell with a graphene-silicon quantum dot hybrid structure, the method including: forming a silicon quantum dot layer, in which a silicon oxide layer includes a plurality of silicon quantum dots, on a substrate; forming a graphene layer on the silicon quantum dot layer; forming a metal nanowire layer on the graphene layer to complete a hybrid structure; and forming electrodes on upper and lower parts of the hybrid structure.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIGS. 2A to 2G illustrate a process of manufacturing a solar cell with a graphene-silicon quantum dot hybrid structure according to an embodiment of the present disclosure;

FIGS. 11A to 11C illustrate a process of manufacturing a solar cell with a graphene-silicon quantum dot hybrid structure according to another embodiment of the present disclosure;

DETAILED DESCRIPTION OF THE DISCLOSURE

Figure 1:
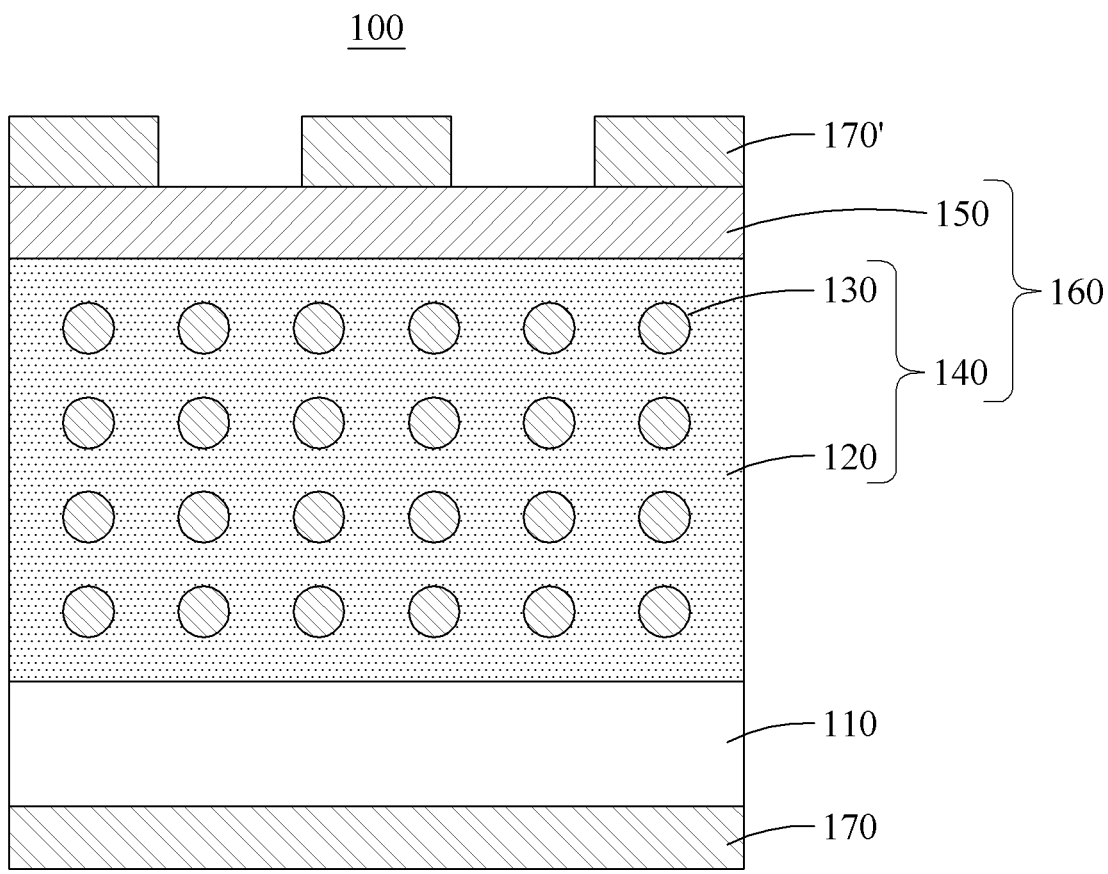
FIG. 1 illustrates a sectional view of a solar cell with a graphene-silicon quantum dot hybrid structure according to an embodiment of the present disclosure.

Hereinafter, the embodiments of the present disclosure are described with reference to the accompanying drawings and the description thereof but are not limited thereto.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

Further, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, a solar cell with a graphene-silicon quantum dot hybrid structure according to an embodiment of the present disclosure is described referring to FIG. 1.

FIG. 1 illustrates a sectional view of a solar cell with a graphene-silicon quantum dot hybrid structure according to an embodiment of the present disclosure.

Referring to FIG. 1, a solar cell 100 with a graphene-silicon quantum dot hybrid structure according to an embodiment of the present disclosure includes a hybrid structure 160 that is constituted of a silicon quantum dot layer 140, which includes a silicon oxide layer 120 and a plurality of silicon quantum dots 130 formed inside the silicon oxide layer 120, and a doped graphene layer 150 formed on the silicon quantum dot layer 140; and electrodes 170 and 170' formed on upper and lower parts of the hybrid structure 160.

The hybrid structure 160 and electrodes 170 and 170' of the solar cell 100 with a graphene-silicon quantum dot hybrid structure are characterized by being annealed. This annealing may be performed at 450° C. to 550° C.

The doped graphene layer 150 of the solar cell 100 with a graphene-silicon quantum dot hybrid structure may be formed by doping with any one dopant selected from the group consisting of $AuCl_3$, B, $HNO_3$, and $RhCl_3$, and may have a sheet resistance of 150 ohm/sq to 500 ohm/sq.

The solar cell 100 with a graphene-silicon quantum dot hybrid structure may further include a substrate 110. The hybrid structure 160 of the solar cell 100 with a graphene-silicon quantum dot hybrid structure may be formed on the substrate 110, and the electrodes 170 and 170' may be respectively formed on an upper part of the hybrid structure 160 and a lower part of the substrate 110 on which the hybrid structure 160 is formed.

Hereinafter, a process of manufacturing the solar cell with a graphene-silicon quantum dot hybrid structure according to an embodiment of the present disclosure is described referring to FIGS. 2A to 2G.

FIGS. 2A to 2G illustrate a process of manufacturing a solar cell with a graphene-silicon quantum dot hybrid structure according to an embodiment of the present disclosure.

As described in FIG. 1, the solar cell 100 with a graphene-silicon quantum dot hybrid structure includes the silicon quantum dot layer 140 that includes the silicon oxide layer 120 and the silicon quantum dots 130 formed inside the silicon oxide layer 120.

Figure 2A:
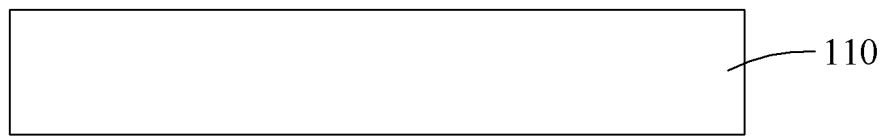
Figure 2B:
Figure 2C:
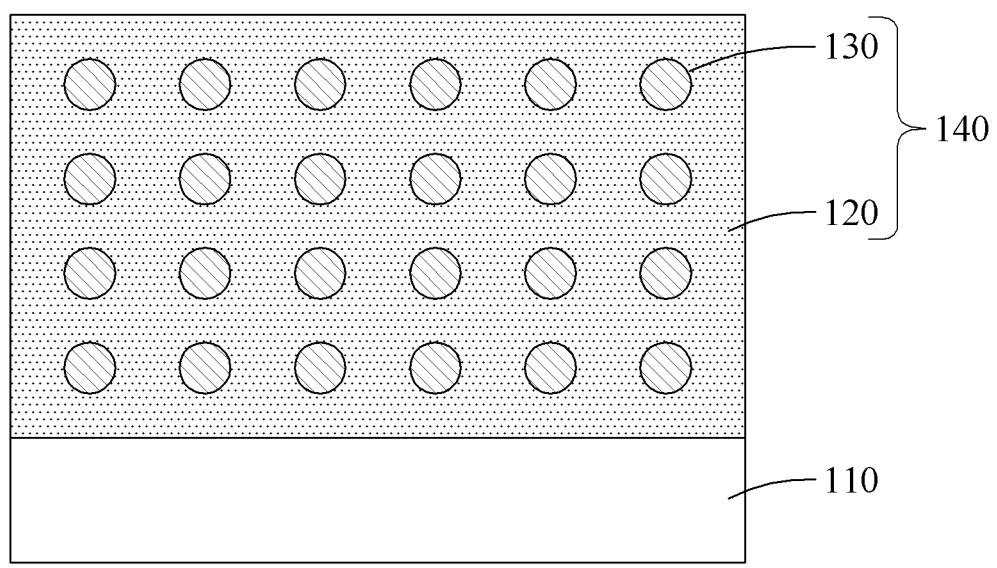

Referring to FIGS. 2A to 2C, a method of manufacturing the solar cell with a graphene-silicon quantum dot hybrid structure according to an embodiment of the present disclosure includes a step of forming the silicon quantum dot layer 140 on the substrate 110. Here, the silicon quantum dot layer 140 includes the silicon oxide layer 120 and the silicon quantum dots 130 formed inside the silicon oxide layer 120.

In particular, the step of forming the silicon quantum dot layer 140 on the substrate 110 may include a step of preparing a substrate (see FIG. 2A), a method of manufacturing a multi-layered sample by alternately laminating a silicon oxide ($SiO_2$) thin film 121 and a boron (B)-doped silicon suboxide ($SiO_x$) thin film 122 on the substrate 110 (see FIG. 2B), and a step of forming the silicon quantum dot layer 140 in which the silicon quantum dots 130 are uniformly distributed in the silicon oxide layer 120 by annealing the sample (not shown) (see FIG. 2C).

As described above, boron (B) is used as a dopant of the doped silicon suboxide ($SiO_x$) thin film 122, but other materials, other than boron (B), may naturally be used. For example, the doped silicon suboxide ($SiO_x$) thin film 122 may be a boron (B), gallium (Ga), or indium (In)-doped silicon suboxide ($SiO_x$) thin film 122.

In accordance with an embodiment, the step of forming the silicon quantum dot layer 140 on the substrate 110 may be a step of manufacturing a multi-layered sample by alternately laminating the silicon oxide ($SiO_2$) thin film 121 and the boron (B)-doped silicon suboxide ($SiO_x$) thin film 122 on the substrate 110, and then forming the silicon quantum dot layer 140, in which the silicon quantum dots 130 are included in the silicon oxide layer 120, by thermally treating the manufactured multi-layered sample.

For example, the silicon quantum dot layer 140 may be formed by alternately depositing 2 nm of the silicon oxide ($SiO_2$) thin film 121 and 2 nm of the boron (B)-doped silicon suboxide ($SiO_x$) thin film 122 on the substrate 110 at a predetermined cycle using an ion beam sputtering deposition method, and then performing rapid heat treatment at 1,000° C. to 1,200° C. for 10 to 30 minutes under a nitrogen atmosphere.

In this case, the 2 nm silicon oxide ($SiO_2$) thin film 121 and the 2 nm boron (B)-doped silicon suboxide ($SiO_x$) thin film 122 may be deposited to a thickness of 100 nm by repeating 25 cycles. In addition, the silicon suboxide ($SiO_x$) thin film 122 may be controlled such that x is 0.8 to 1.6, and the sizes of the silicon quantum dots may be controlled corresponding to the value of x. In addition, the value of x may be controlled using an X-ray photoelectron spectroscope (XPS).

As illustrated in FIG. 1, the solar cell 100 with a graphene-silicon quantum dot hybrid structure includes the doped graphene layer 150 formed on the silicon quantum dot layer 140. That is, the hybrid structure 160 included in the solar cell 100 with a graphene-silicon quantum dot hybrid structure is constituted of the silicon quantum dot layer 140 and the doped graphene layer 150.

The doped graphene 150 may be manufactured by controlling a doping concentration of a graphene thin film 151 deposited, through chemical vapor deposition, on a catalyst layer by reacting the catalyst layer with a carbon-containing mixed gas. Hereinafter, a method of manufacturing the doped graphene 150 is described in detail.

Figure 2D:
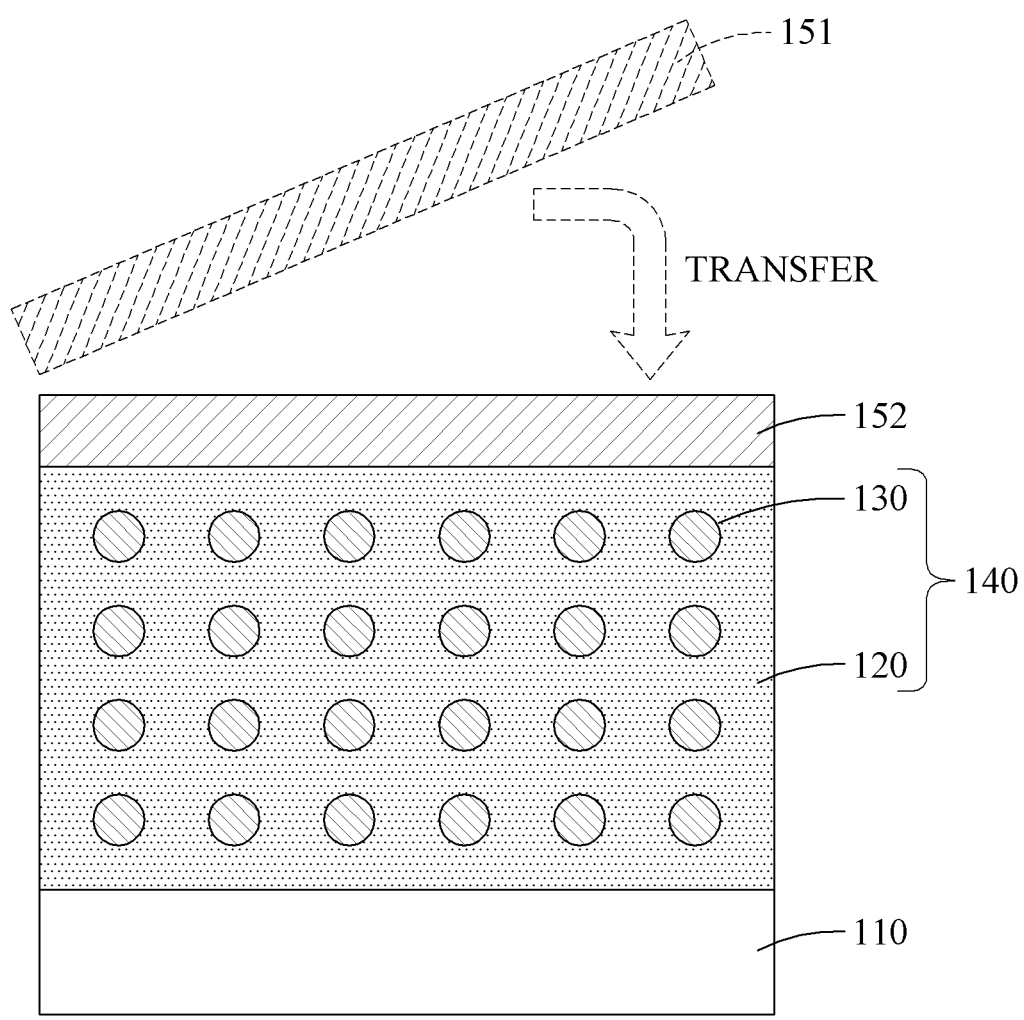
Figure 2E:
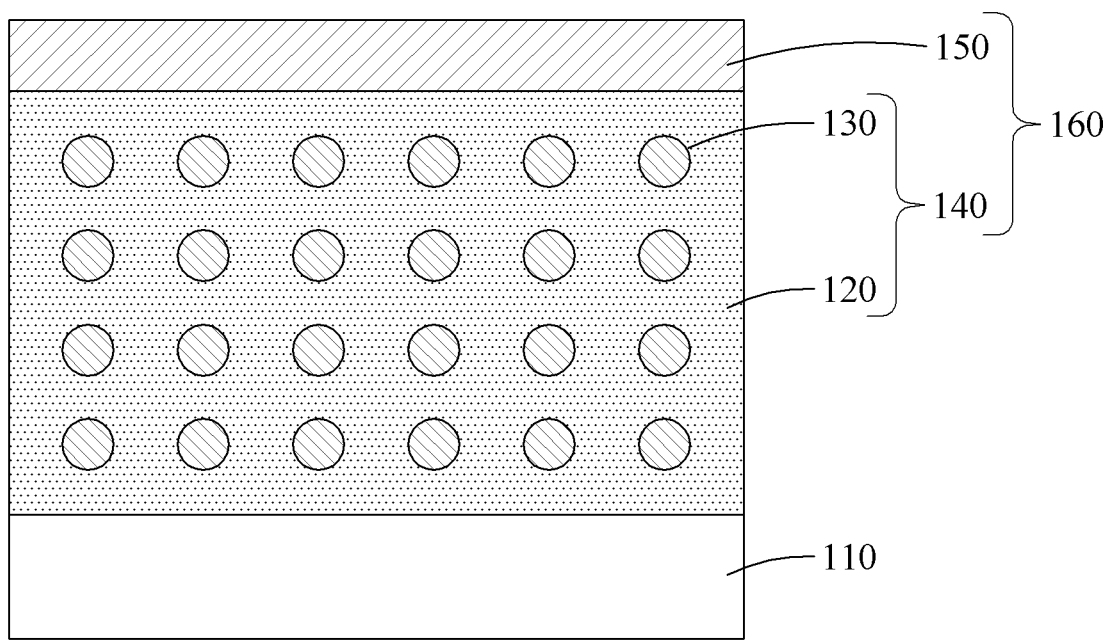

Referring to FIGS. 2D and 2E, the method of manufacturing a solar cell with a graphene-silicon quantum dot hybrid structure according to an embodiment of the present disclosure includes a step of forming the hybrid structure 160 by forming the doped graphene layer 150 on the silicon quantum dot layer 140.

In particular, the step of forming the hybrid structure 160 by forming the doped graphene layer 150 on the silicon quantum dot layer 140 may include a step of forming a graphene thin film on a catalyst layer by reacting a carbon-containing mixed gas with the catalyst layer through chemical vapor deposition (not shown), a step of forming the graphene layer 152 by transferring the formed graphene thin film 151 onto the silicon quantum dot layer 140 and performing annealing treatment (see FIG. 2D), and a step of forming the doped graphene layer 150 by spin-coating a solution including a solution including $AuCl_3$ on the graphene layer 152 and performing annealing treatment (see FIG. 2E).

In accordance with an embodiment, in the step of forming the graphene thin film on the catalyst layer by reacting a carbon-containing mixed gas with a catalyst layer through chemical vapor deposition, the graphene thin film may be formed by a crystallized graphene structure of carbon atoms, which are included in the catalyst layer, formed on a surface of the catalyst layer through deposition of a metal (e.g., copper or nickel), which is utilized as a catalyst layer, on the substrate, and reaction of a mixed gas of methane and hydrogen with the catalyst layer at high temperature such that a proper amount of carbon is dissolved in or adsorbed to the catalyst layer, followed by cooling. Subsequently, the catalyst layer is removed and the graphene thin film 151 is separated from the substrate, thereby completing the separated (formed) graphene thin film 151.

In the step of forming the graphene layer 152 by transferring the formed graphene thin film 151 onto the silicon quantum dot layer 140 after the step of forming the graphene thin film on the catalyst layer, the graphene layer 152 may be formed by transferring the formed graphene thin film 151, which has been separated from the substrate, onto the silicon quantum dot layer 140 and annealing the same, as illustrated in FIG. 2D.

For example, in the method of manufacturing the graphene thin film, a 70 μm copper (Cu) foil, as a catalyst layer, was disposed on a substrate in a quartz tube, followed by changing the flow rate of a methane gas from 10 sccm to 30 sccm, fixing the flow rate of hydrogen gas to 10 sccm, and fixing a process pressure to 3 mTorr, so as to synthesize the graphene thin film.

Subsequently, polymethyl methacrylate (PMMA) was spin-coated on the synthesized graphene thin film. PMMA coating serves to fix the graphene thin film when the copper foil is removed using an ammonium persulfate solution.

After removing the copper foil using the ammonium persulfate solution, the ammonium persulfate solution remaining on the graphene thin film was washed with DI water, and the washed graphene thin film was transferred onto the silicon quantum dot layer 140.

The synthesized and washed graphene thin film was transferred onto the silicon quantum dot layer 140, and then annealed, for example, at 50° C. to 100° C. for 3 hours to 5 hours so as to remove moisture and the like.

Subsequently, to increase contact force (binding force) between the silicon quantum dot layer 140 and the transferred graphene thin film, additional annealing was performed, for example, at 150° C. to 200° C. for three hours to four hours. As a result, the graphene layer 152 was formed.

After the step of forming the graphene layer 152 on the silicon quantum dot layer 140, a solution including $AuCl_3$ is spin-coated on the graphene layer 152, followed by annealing. As a result, the doped graphene layer 150 is formed (see FIG. 2E).

The doped graphene layer 150 may be manufactured by spin-coating a p- or n-type doping solution on the graphene layer 152 and annealing the same.

Although a p-type doping solution was used as the solution including $AuCl_3$ above, a solution including a substance, other than $AuCl_3$, may naturally be used. For example, the doping solution may include $AuCl_3$, B, $HNO_3$, and $RhCl_3$ dopants, and the graphene layer 152 may be doped with $AuCl_3$, B, $HNO_3$ and $RhCl_3$ by using the doping solution.

For example, the doped graphene layer 150 may be manufactured by spin-coating 1.0 mM to 30 mM $AuCl_3$ on the graphene layer 152 that is transferred onto and formed on the silicon quantum dot layer 140, and annealing the same at 90° C. to 110° C. for 10 minutes.

A doping concentration of the doped graphene layer 150 may be controlled by adjusting the concentration of $AuCl_3$. For example, the concentration of $AuCl_3$ in the doping solution may be 1.0 mM to 30 mM, preferably 1.0 mM to 20 mM, more preferably 1.0 mM to 10 mM.

As illustrated in FIG. 1, the solar cell 100 with a graphene-silicon quantum dot hybrid structure includes the electrodes 170 and 170' respectively formed on upper and lower parts of the hybrid structure 160.

Figure 2F:
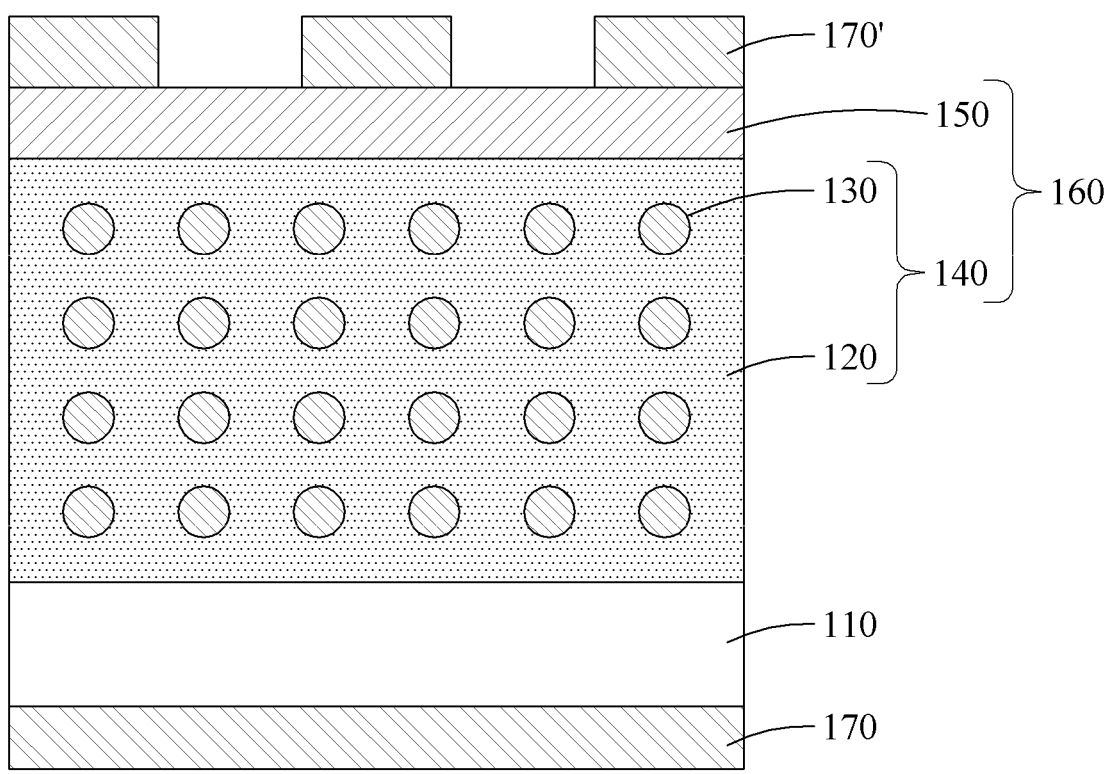

Referring to FIG. 2F, the method of manufacturing a solar cell with a graphene-silicon quantum dot hybrid structure according to an embodiment of the present disclosure includes a step of respectively forming the electrodes 170 and 170' on upper and lower parts of the hybrid structure 160.

In particular, the step of respectively forming the electrodes 170 and 170' on upper and lower parts of the hybrid structure 160 is a step of forming the electrodes 170 and 170' on upper and lower parts of the graphene-silicon quantum dot hybrid structure 160 on the substrate formed through the manufacturing processes of FIG. 2A to FIG. 2E.

The electrodes 170 and 170' may be formed on upper and lower parts of the graphene-silicon quantum dot the hybrid structure 160 using, for example, a mono-metal, such as aluminum (Al), chromium (Cr) or gold (Au), or a multi-metal wherein chromium (Cr) and gold (Au) are sequentially deposited.

In detail, the solar cell 100 with a graphene-silicon quantum dot hybrid structure may further include the substrate 110, and thus, the hybrid structure 160 may be formed on the substrate 110. Accordingly, the electrodes 170 and 170' may be respectively formed on an upper part of the hybrid structure 160 and a lower part of the substrate 110 formed on the hybrid structure 160.

According to an aspect of the present disclosure, the doped graphene layer 150 of the solar cell with a graphene-silicon quantum dot hybrid structure uniformizes the generation of electrons and holes by sunlight (light), thereby smoothing current spreading. Accordingly, the doped graphene layer 150 may serve as a spreading electrode. Accordingly, due to the doped graphene layer 150 which may serve as a spreading electrode, the electrode 170' formed on an upper part of the hybrid structure 160, i.e., an upper part of the doped graphene layer 150, may be less densely formed.

When the electrode 170 is made of a metal, this opaque metal electrode partially blocks sunlight, and thus, the efficiency of a solar cell is decreased. However, according to an aspect of the present disclosure, the doped graphene layer 150 serves as a spreading electrode, and thus, the metal electrode 170' may be less densely formed. Accordingly, an area which is blocked by the sunlight is reduced, thereby increasing the efficiency of a solar cell.

As illustrated in FIG. 1, the solar cell 100 with a graphene-silicon quantum dot hybrid structure is characterized by being manufactured by annealing the hybrid structure 160 and the electrodes 170 and 170'.

Referring to FIG. 2G, the method of manufacturing a solar cell with a graphene-silicon quantum dot hybrid structure according to an embodiment of the present disclosure includes a step of annealing the hybrid structure 160 including the electrodes 170 and 170'.

As illustrated in FIG. 2G, when the step of annealing the hybrid structure 160 including the electrodes 170 and 170' is performed, contact characteristics between respective layers, such as between the electrode 170' and the doped graphene layer 150 and between the doped graphene layer 150 and the silicon quantum dot layer 140, are increased and thus the current flow becomes smooth, thereby increasing the efficiency of a solar cell.

The annealing may be performed at 450° C. to 550° C., preferably 500° C. to 550° C., more preferably 540° C. When the temperature of the annealing is less than 450° C., contact characteristics between respective layers of the solar cell might not be sufficiently changed. When the temperature of the annealing is greater than 550° C., substances constituting a solar cell may cause chemical transformation.

In addition, the annealing may be performed for 5 minutes to 120 minutes, preferably 10 minutes to 60 minutes, more preferably 20 minutes to 40 minutes. In addition, a rapid heat treatment method may be used. When the annealing time is less than 5 minutes, contact characteristics between respective layers of the solar cell might not be sufficiently changed. When the annealing time is greater than 120 minutes, substances constituting the solar cell may cause chemical transformation and too much time is spent.

Figure 3:
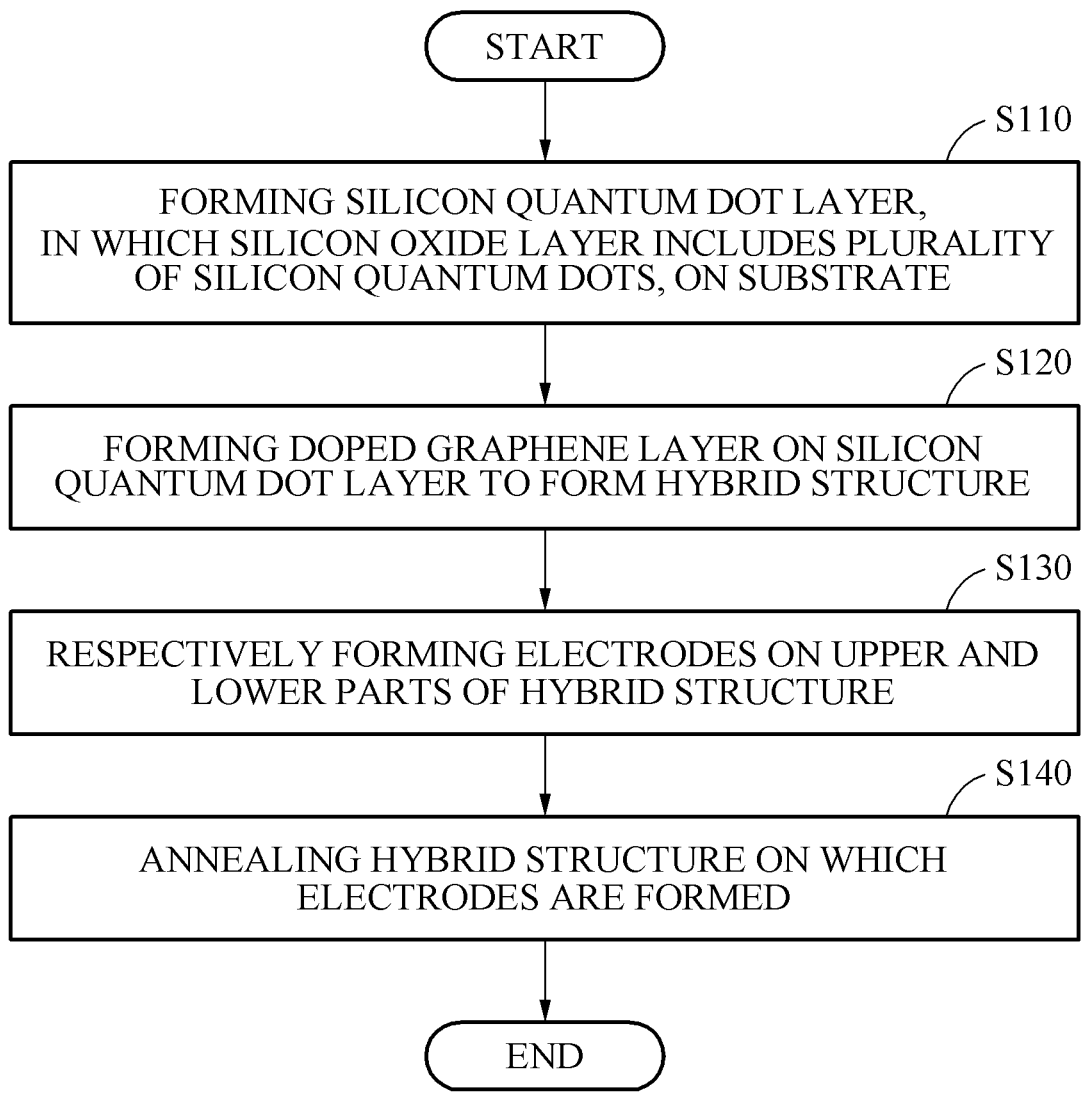
FIG. 3 illustrates a flowchart of a method of manufacturing a solar cell with a graphene-silicon quantum dot hybrid structure according to an embodiment of the present disclosure.

FIG. 3 illustrates a flowchart of the method of manufacturing a solar cell with a graphene-silicon quantum dot hybrid structure according to an embodiment of the present disclosure.

Referring to FIG. 3, in S110, the silicon quantum dot layer, in which the silicon oxide layer includes the plurality of silicon quantum dots, is formed on the substrate.

S110 may include a step of manufacturing a multi-layered sample by alternately laminating the silicon oxide ($SiO_2$) thin film and the boron (B)-doped silicon suboxide ($SiO_x$) thin film on the substrate and a step of forming the silicon quantum dot layer, in which the silicon quantum dots are uniformly distributed in the silicon oxide layer, by annealing the sample.

In S120, the doped graphene layer is formed on the silicon quantum dot layer, thereby forming the hybrid structure.

S120 may include a step of forming the graphene thin film on the catalyst layer by reacting a carbon-containing mixed gas with a catalyst layer through chemical vapor deposition, a step of forming a graphene layer by transferring the formed graphene thin film onto the silicon quantum dot layer and annealing the same, and a step of forming the doped graphene layer by spin-coating a solution including $AuCl_3$ on the graphene layer and annealing the same.

In S130, electrodes are respectively formed on upper and lower parts of the hybrid structure.

In S140, the hybrid structure including the formed electrodes is subjected to annealing.

In S140, the annealing may be performed at 450° C. to 550° C.

Hereinafter, Raman spectrum characteristics, which are dependent upon a doping concentration of graphene, of a solar cell with the graphene-silicon quantum dot hybrid structure according to an embodiment of the present disclosure are described referring to FIGS. 4A to 4C.

Figure 4A:
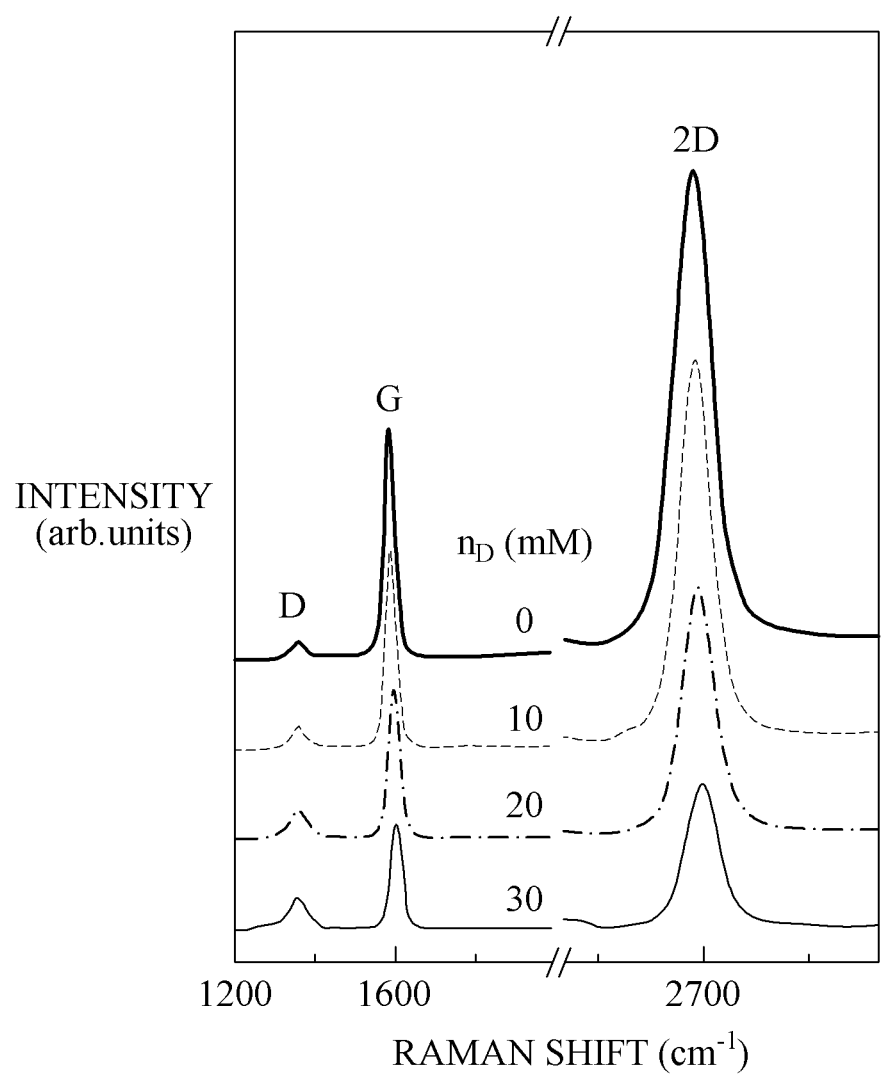
FIGS. 4A to 4C illustrate Raman spectrum characteristics, which are dependent upon a doping concentration of graphene, of a solar cell with a graphene-silicon quantum dot hybrid structure according to an embodiment of the present disclosure.
Figures 4B, 4C:
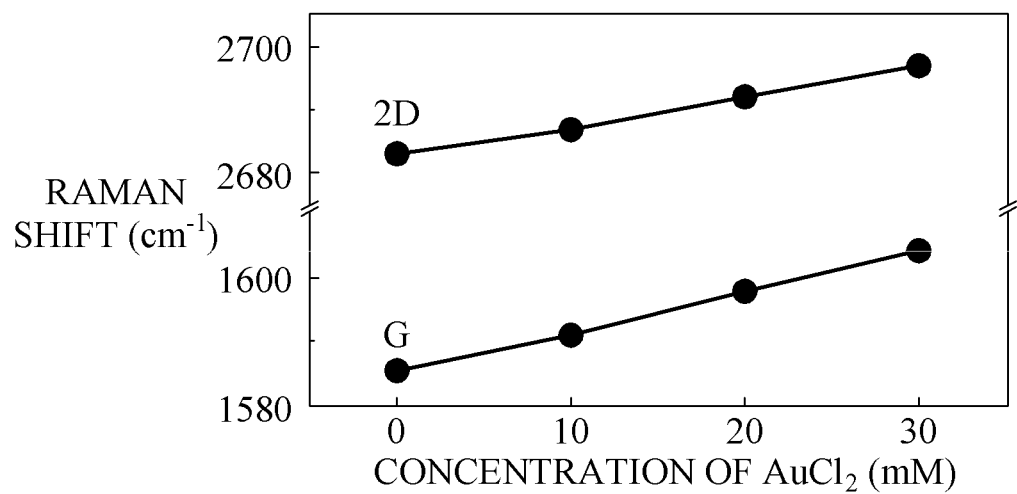

FIG. 4A illustrates a Raman spectrum according to a doping concentration of graphene with respect to solar cells with the graphene-silicon quantum dot hybrid structure according to an embodiment of the present disclosure, FIG. 4B illustrates the highest positions of 2D and G peaks according to a doping concentration of graphene, and FIG. 4C illustrates a Raman intensity ratio of D peak to G peak (I(D/G)) and a Raman intensity ratio of G peak to 2D peak (I(G/2D)) according to a doping concentration of graphene.

In particular, FIGS. 4A to 4C illustrate Raman spectrum characteristics of solar cells having the graphene layer-silicon quantum dot layer hybrid structure manufactured by varying a AuCl3 doping concentration of graphene from 0 mM to 30 mM (in 10 mM intervals). Two-dimensional materials, such as graphene, have strong electron-phonon coupling, thus exhibiting various Raman peaks.

Referring to FIG. 4A, it can be confirmed that D, G, and 2D peaks are generated per $AuCl_3$ doping concentration of graphene. In particular, in the Raman spectrum of graphene, G peaks near ~1590 cm$^{-1}$ and 2D peaks near ~2700 cm$^{-1}$ are most remarkable. Along with these, D peaks are observed near ~1340 cm$^{-1}$. Such D peaks are Raman peaks related to graphene defects. With increasing $AuCl_3$ doping concentration of graphene, the intensity of G peak gradually increases and a vibration number of G peak increases.

Referring to FIG. 4B, it can be confirmed that the highest positions of all of the 2D and G peaks are blue-shifted in a high wavenumber direction with increasing $AuCl_3$ doping concentration of graphene. Such Raman peak change indicates that the structures of electrons are changed by a doping concentration of $AuCl_3$ of graphene. In particular, this result indicates that the structures of electrons are gradually changed in one direction, i.e., in a direction in which Raman scattering energy increases.

In FIG. 4C, I(D/G) represents a defect ratio in graphene and is related to the thickness (a layer number) of graphene. Referring to FIG. 4C, it can be confirmed that I(D/G) and I(G/2D) gradually increase with increasing $AuCl_3$ doping concentration of graphene. Such Raman intensity ratio change is caused by interaction between impurities and graphene according to increase in a $AuCl_3$ doping concentration of graphene. It can be confirmed that, through changes in Raman G and 2D peaks, p-type doping of graphene has been satisfactorily performed at every concentration.

Figure 5:
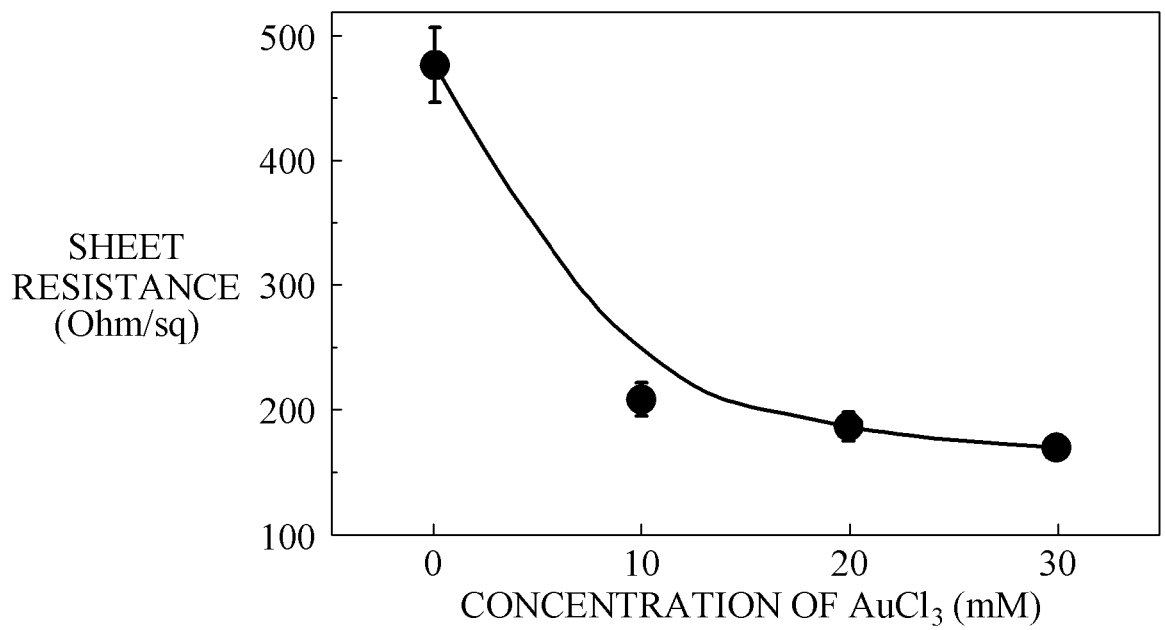
FIG. 5 illustrates graphene sheet resistance, which is dependent upon a doping concentration of graphene, of solar cells with a graphene-silicon quantum dot hybrid structure according to an embodiment of the present disclosure.

FIG. 5 illustrates graphene sheet resistance, which is dependent upon a doping concentration of graphene, of solar cells with the graphene-silicon quantum dot hybrid structure according to an embodiment of the present disclosure.

In particular, FIG. 5 illustrates sheet resistance change in graphene with respect to solar cells having the graphene layer-silicon quantum dot layer hybrid structure manufactured by varying a AuCl3 doping concentration of graphene from 0 mM to 30 mM (in 10 mM intervals).

Referring to FIG. 5, it can be confirmed that the sheet resistance of graphene in initial state is 450 ohm/sq to 500 ohm/sq, and the sheet resistance of doped graphene is decreased to 170 ohm/sq as the doping concentration of $AuCl_3$ increases from 0 mM to 30 mM.

Figure 6:
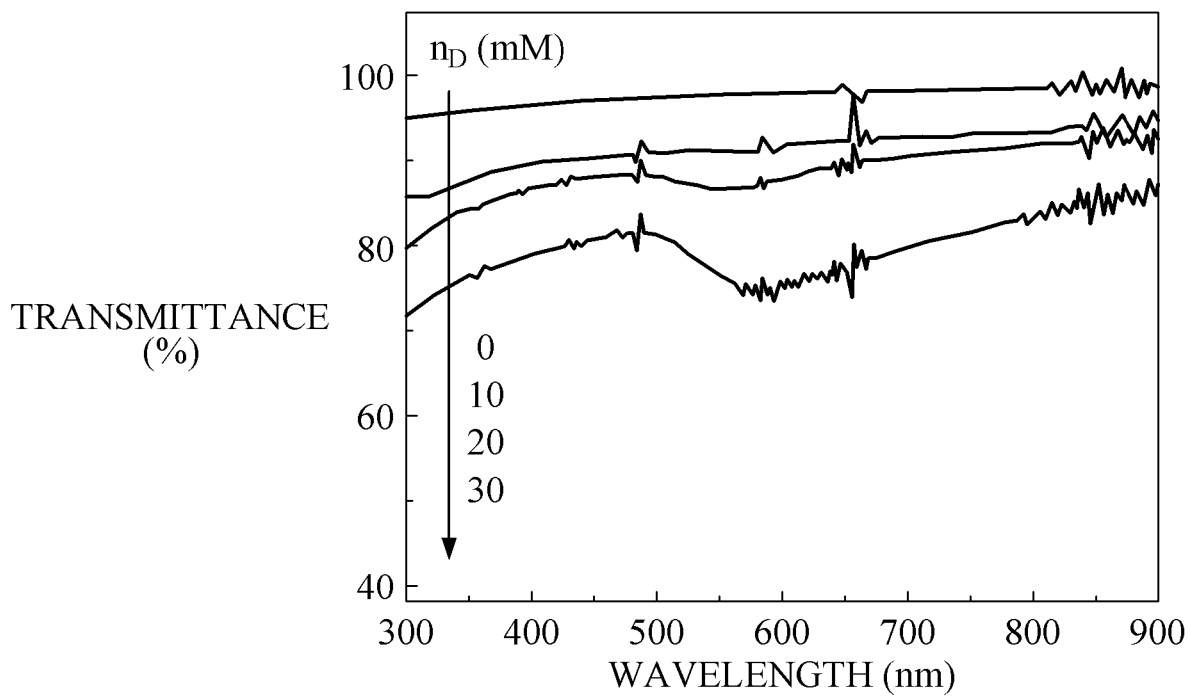
FIG. 6 illustrates graphene transmittance, which is dependent upon a doping concentration of graphene, of solar cells with a graphene-silicon quantum dot hybrid structure according to an embodiment of the present disclosure.

FIG. 6 illustrates graphene transmittance, which is dependent upon a doping concentration of graphene, of solar cells with the graphene-silicon quantum dot hybrid structure according to an embodiment of the present disclosure.

In particular, FIG. 6 illustrates transmittance change in graphene with respect to solar cells having the graphene layer-silicon quantum dot layer hybrid structure manufactured by varying a AuCl3 doping concentration of graphene from 0 mM to 30 mM (in 10 mM intervals).

Referring to FIG. 6, it can be confirmed that transmittance at a wavelength of 550 nm with respect to doped graphene is decreased from 97.4% to 76.9% as the doping concentration of $AuCl_3$ increases from 0 mM to 30 mM.

Figure 7:
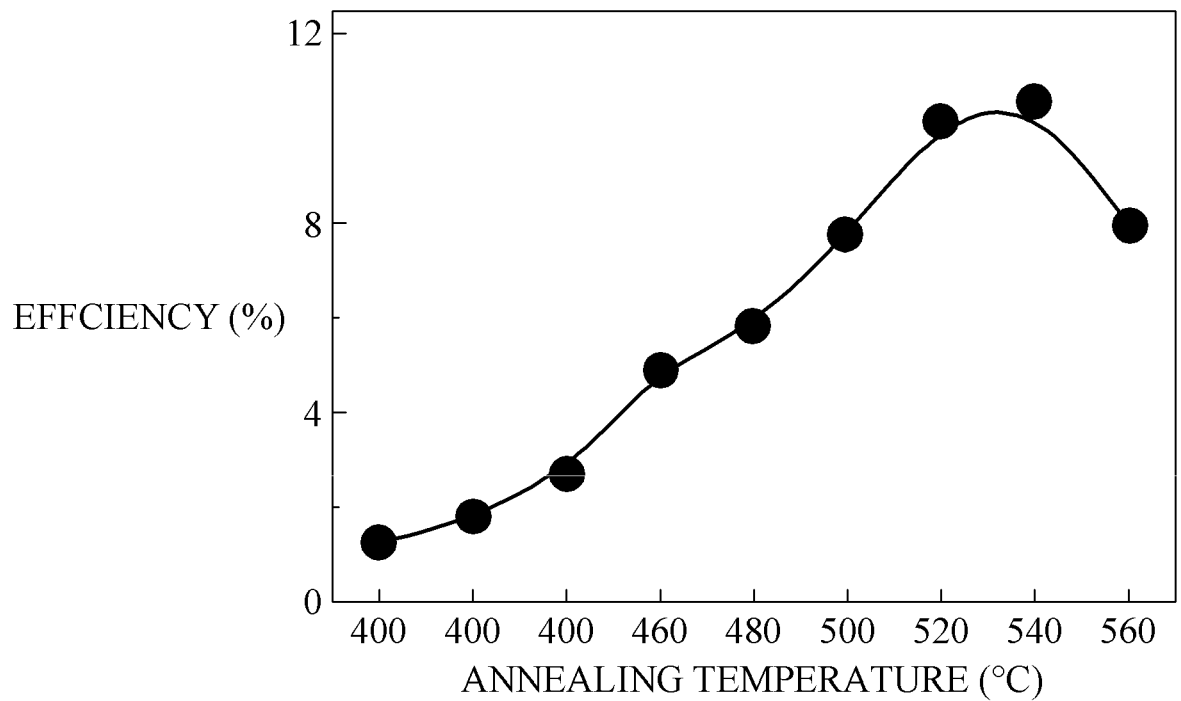
FIG. 7 illustrates a change, which is dependent upon annealing temperature, in characteristics of solar cells with a graphene-silicon quantum dot hybrid structure according to an embodiment of the present disclosure.

FIG. 7 illustrates a change, which is dependent upon annealing temperature, in characteristics of solar cells with the graphene-silicon quantum dot hybrid structure according to an embodiment of the present disclosure.

In particular, FIG. 7 illustrates energy conversion efficiencies of solar cells having the graphene layer-silicon quantum dot layer hybrid structure 160, on which the electrodes 170 and 170' are formed, manufactured by varying an annealing temperature from 400° C. to 560° C. (in 20° C. intervals).

Referring to FIG. 7, it can be confirmed that the energy conversion efficiency of the solar cell increases to around 540° C. and is decreased above 540° C., as annealing temperature increases from 400° C. to 560° C. In addition, the energy conversion efficiency of the solar cell is 10.6% at an annealing temperature of 540° C.

The energy conversion efficiency of the solar cell increases with increasing annealing temperature because the contact characteristics between respective layers of the solar cell increase with increasing annealing temperature. In addition, the energy conversion efficiency increases up to around 540° C. and decreases after 540° C. is because, after 540° C., substances constituting the solar cell cause chemical transformation and thus the solar cell is damaged.

Accordingly, by annealing a solar cell according to an embodiment of the present disclosure, a solar cell with a graphene-silicon quantum dot hybrid structure having increased stability and energy conversion efficiency may be manufactured.

Figure 8:
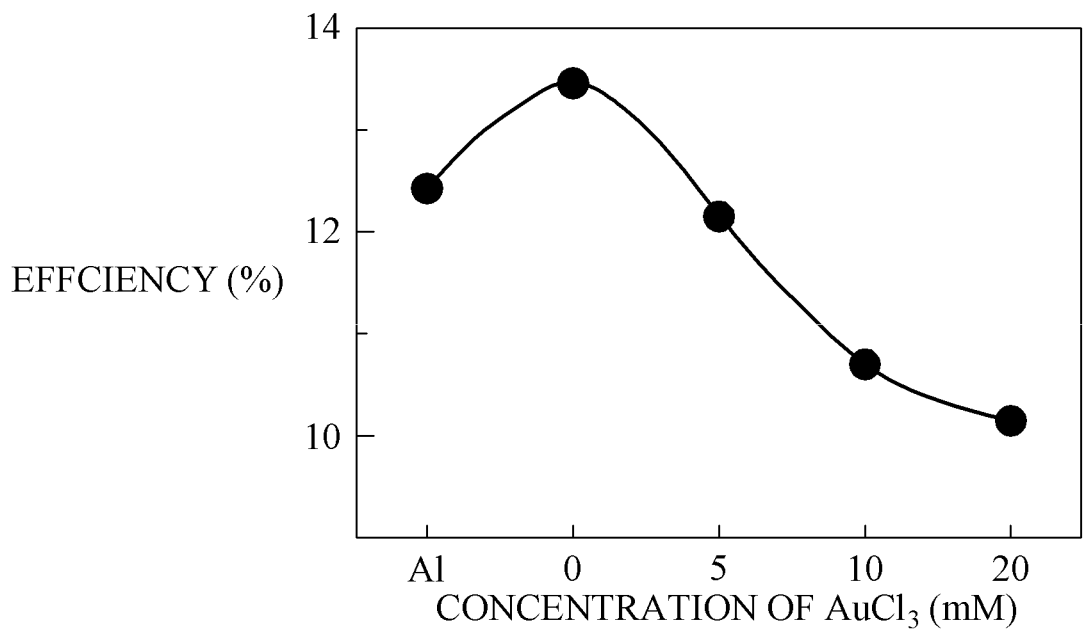
FIG. 8 illustrates a change, which is dependent upon a doping concentration of graphene, in characteristics of solar cells with a graphene-silicon quantum dot hybrid structure (doped graphene layer-silicon quantum dot layer hybrid structure) according to an embodiment of the present disclosure.

FIG. 8 illustrates a change, which is dependent upon a doping concentration of graphene, in characteristics of solar cells with the graphene-silicon quantum dot hybrid structure (doped graphene layer-silicon quantum dot layer hybrid structure) according to an embodiment of the present disclosure.

In particular, FIG. 8 illustrates energy conversion efficiencies of a solar cell having the aluminum (Al)-silicon quantum dot hybrid structure, instead of the graphene-silicon quantum dot hybrid structure, and solar cells having the graphene-silicon quantum dot hybrid structure manufactured by varying a AuCl3 doping concentration to 0 mM, 5 mM, 10 mM and 20 mM.

Referring to FIG. 8, it can be confirmed that the energy conversion efficiency of a solar cell with a graphene-silicon quantum dot hybrid structure wherein a doping concentration with $AuCl_3$ is 0 mM is 13.45%, which is about 1% higher than that of the solar cell having the aluminum (Al)-silicon quantum dot hybrid structure.

However, it can be confirmed that the energy conversion efficiency of a solar cell is decreased with increasing $AuCl_3$ doping concentration of a graphene (layer). This result may be caused due to dopants directly exposed to the air during a process after doping. Such a problem may be addressed by preventing dopants from being exposed to the air through encapsulation.

Figure 9A:
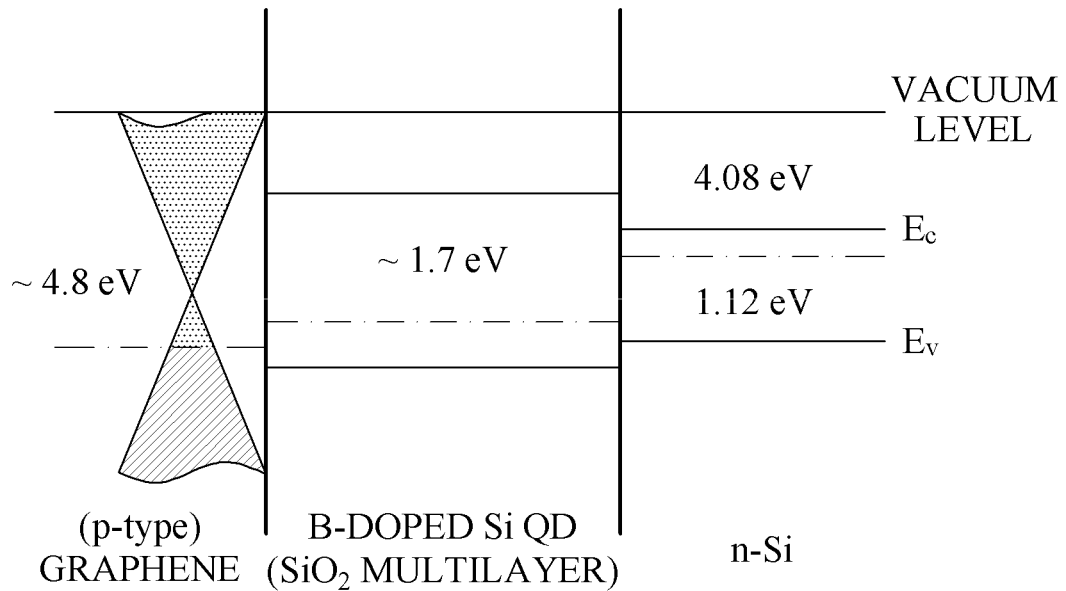
FIGS. 9A and 9B illustrate a band structure and mechanism of graphene and silicon quantum dots doped on a solar cell with a graphene-silicon quantum dot hybrid structure according to an embodiment of the present disclosure.
Figure 9B:
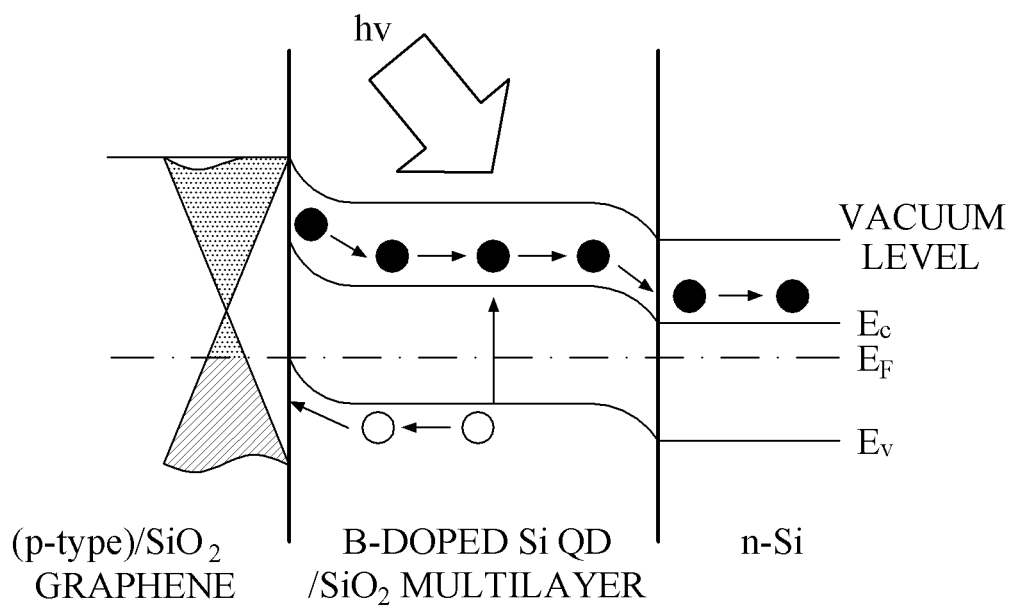

FIGS. 9A and 9B illustrate a band structure and mechanism of doped graphene and silicon quantum dots in a solar cell with the graphene-silicon quantum dot hybrid structure according to an embodiment of the present disclosure.

Referring to FIGS. 9A and 9B, in a solar cell with the graphene-silicon quantum dot hybrid structure, the work function of graphene increases with increasing $AuCl_3$ doping concentration of the doped graphene, whereby the Fermi level of graphene is below the Dirac point.

Accordingly, electrons and holes generated in the solar cell with the graphene-silicon quantum dot hybrid structure are more easily separated, which indicates that the properties of the solar cell have been improved. As such, electrical characteristics are improved when $AuCl_3$ doping concentration is increased. However, as described above, when $AuCl_3$ doping concentration is increased, transmittance is decreased. Accordingly, optimal characteristics are exhibited when the $AuCl_3$ doping concentration with is 5 mM.

A solar cell with the graphene-silicon quantum dot hybrid structure including the silicon quantum dot layer and doped graphene layer has been described above referring to FIGS. 1 to 9B.

Hereinafter, a solar cell having a graphene-silicon quantum dot hybrid structure further including an encapsulation layer, other than the silicon quantum dot layer and doped graphene layer, on the doped graphene layer is described referring to FIGS. 10 to 13.

Figure 10:
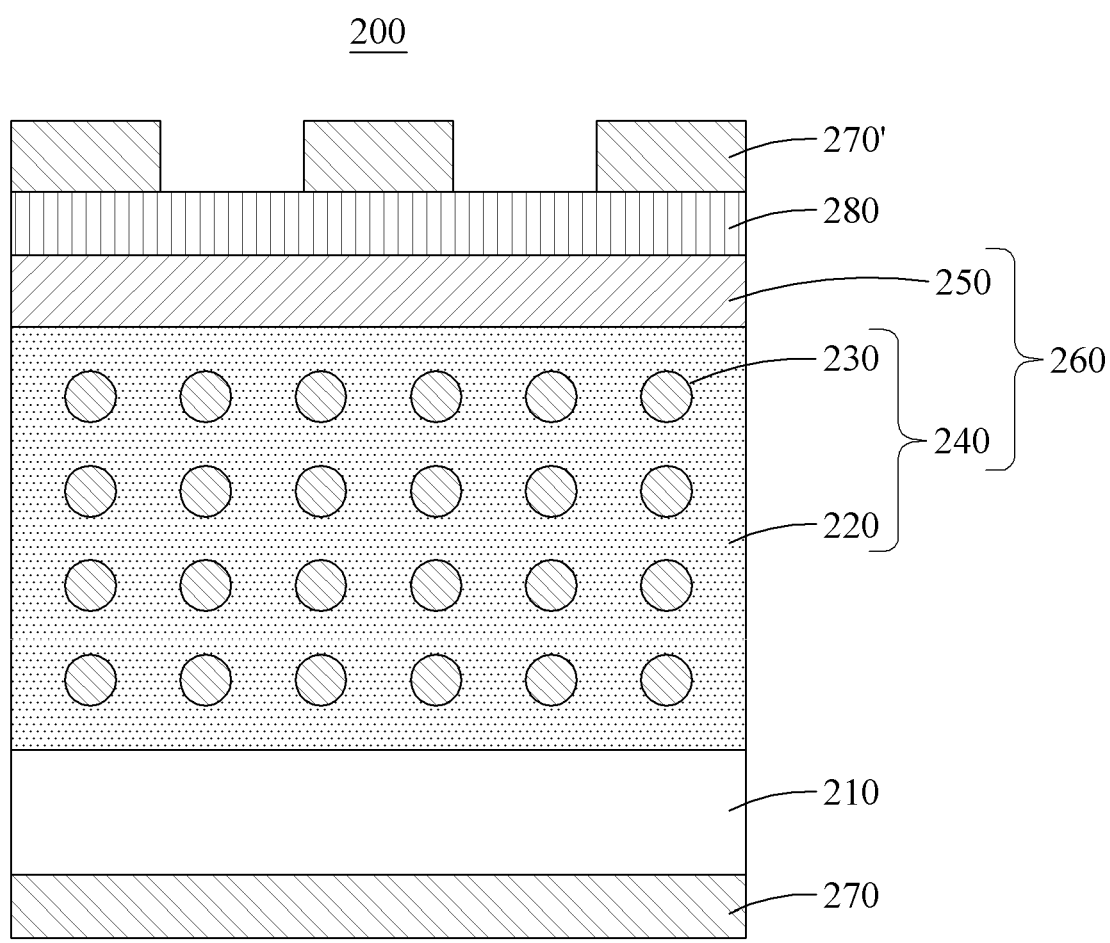
FIG. 10 illustrates a sectional view of a solar cell with a graphene-silicon quantum dot hybrid structure according to another embodiment of the present disclosure.

FIG. 10 illustrates a sectional view of a solar cell with a graphene-silicon quantum dot hybrid structure according to another embodiment of the present disclosure.

Referring to FIG. 10, a solar cell 200 with a graphene-silicon quantum dot hybrid structure according to another embodiment of the present disclosure includes a hybrid structure 260 constituted of a silicon quantum dot layer 240, in which a plurality of silicon quantum dots 230 are included in a silicon oxide layer 220, a doped graphene layer 250 formed on the silicon quantum dot layer 240, and an encapsulation layer 280 formed on the doped graphene layer 250; and electrodes 270 and 270' formed on upper and lower parts of the hybrid structure 260.

The solar cell 200 with the graphene-silicon quantum dot hybrid structure may further include a substrate 210. In the solar cell 200 with the graphene-silicon quantum dot hybrid structure, the hybrid structure 260 may be formed on the substrate 210, and the electrodes 270 and 270' may be respectively formed on upper and lower parts of the hybrid structure 260.

In particular, the hybrid structure 260 of the solar cell 200 includes the silicon quantum dot layer 240, the doped graphene layer 250, and the encapsulation layer 280. Here, the constituents of the silicon quantum dot layer 240 and doped graphene layer 250 may be the same as those of the solar cell 100 with the graphene-silicon quantum dot hybrid structure according to an embodiment of the present disclosure, and thus, descriptions thereof are omitted.

The solar cell 200 with the graphene-silicon quantum dot hybrid structure according to another embodiment of the present disclosure further includes the encapsulation layer 280.

The encapsulation layer 280 is formed on the doped graphene layer 250 to encapsulate the doped graphene layer 250, thereby preventing dopants in the doped graphene layer 250 from being exposed to the air. Accordingly, the energy conversion efficiency of a solar cell may be increased.

The encapsulation layer 280 may be made of a conductive material.

The encapsulation layer 280 may be made of, particularly, graphene. When the encapsulation layer 280 is made of graphene, the encapsulation layer 280 made of graphene may be an undoped (pristine) graphene layer, unlike the doped graphene layer 250.

The encapsulation layer 280 may have a single layer or laminated structure.

Hereinafter, a process of manufacturing the solar cell with a graphene-silicon quantum dot hybrid structure according to another embodiment of the present disclosure is described referring to FIGS. 11A to 11C.

Figure 11A:
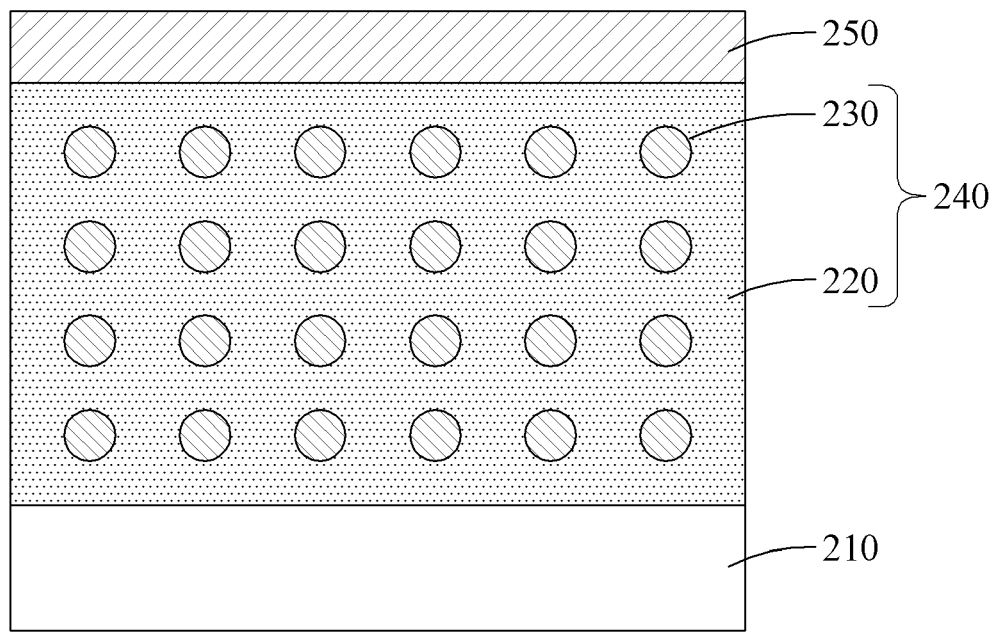
Figure 11C:
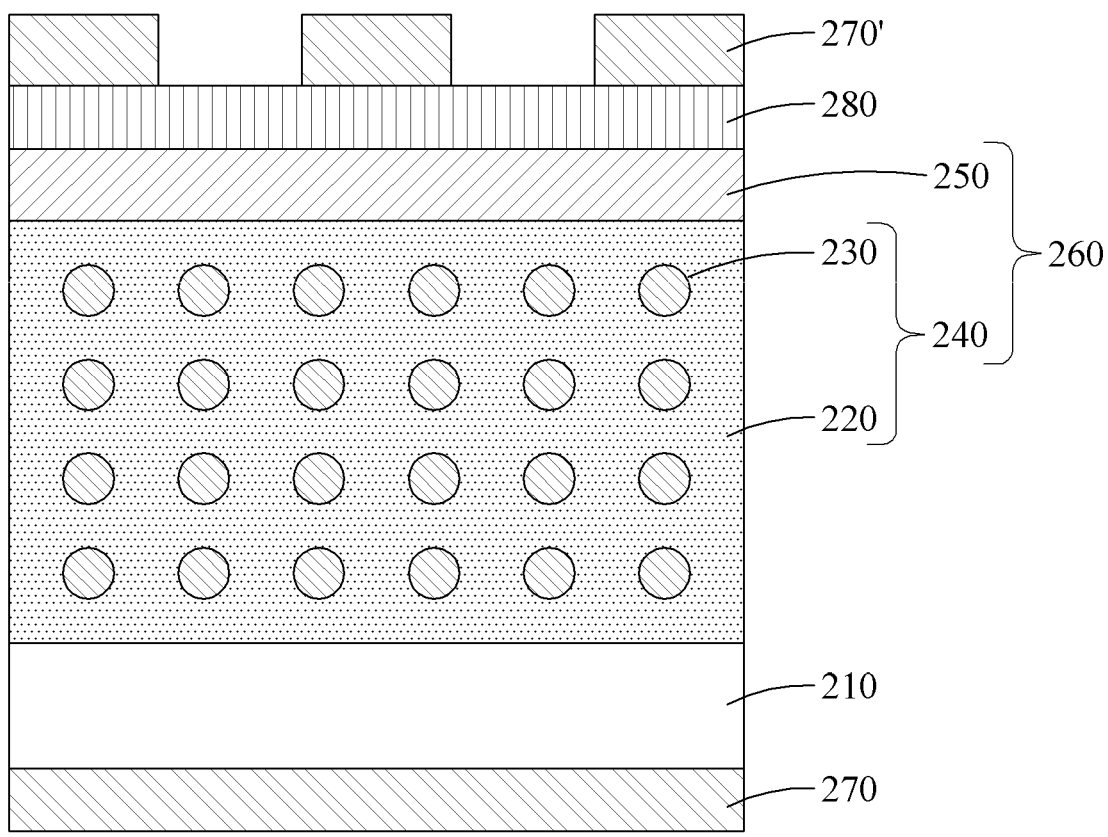

FIGS. 11A to 11C illustrate a process of manufacturing a solar cell with a graphene-silicon quantum dot hybrid structure according to another embodiment of the present disclosure.

As illustrated in FIG. 10, the solar cell 200 with the graphene-silicon quantum dot hybrid structure includes the silicon quantum dot layer 240 formed on the substrate 210 and the doped graphene layer 250 formed on the silicon quantum dot layer 240.

Referring to FIG. 11A, a method of the solar cell with the graphene-silicon quantum dot hybrid structure according to another embodiment of the present disclosure includes a step of forming the silicon quantum dot layer 240 on the substrate 210 and a step of forming the doped graphene layer 250 on the silicon quantum dot layer 240. A method of forming the silicon quantum dot layer 240 and doped graphene layer 250 may be the same as the method of manufacturing the solar cell with the graphene-silicon quantum dot hybrid structure according to an embodiment of the present disclosure, and thus, description thereof is omitted.

As illustrated in FIG. 10, the solar cell 200 with the graphene-silicon quantum dot hybrid structure includes the encapsulation layer 280 formed on the doped graphene layer 250. That is, the hybrid structure 260 included in the solar cell 200 with the graphene-silicon quantum dot hybrid structure is constituted of the silicon quantum dot layer 240, the doped graphene layer 250, and the encapsulation layer 280.

Referring to FIG. 11B, the method of manufacturing the solar cell with the graphene-silicon quantum dot hybrid structure according to another embodiment of the present disclosure includes a step of forming the encapsulation layer 280 on the doped graphene layer 250 to complete the hybrid structure 260.

In particular, the step of forming the encapsulation layer 280 on the doped graphene layer 250 to complete the hybrid structure 260 may include a step of forming a conductive thin film 281 on a substrate (not shown) and a step of transferring the conductive thin film 281 onto the doped graphene layer 250 to form the encapsulation layer 280 (see FIG. 11B).

In accordance with an embodiment of the present disclosure, when the encapsulation layer 280 is made of a conductive material, graphene, the step of forming the encapsulation layer 280 on the doped graphene layer 250 to complete the hybrid structure 260 may include a step of forming a graphene thin film on the catalyst layer by reacting a carbon-containing mixed gas with a catalyst layer (not shown) and a step of forming the encapsulation layer 280 by transferring the graphene thin film onto the doped graphene layer 250 and annealing the same.

In particular, in the step of forming the graphene thin film on the catalyst layer by reacting a carbon-containing mixed gas with a catalyst layer through chemical vapor deposition, the graphene thin film may be formed by a crystallized graphene structure of carbon atoms, which are included in the catalyst layer, formed on a surface of the catalyst layer through deposition of a metal (e.g., copper or nickel), which is utilized as a catalyst layer, on the substrate, and reaction of a mixed gas of methane and hydrogen with the catalyst layer at high temperature such that a proper amount of carbon is dissolved in or adsorbed to the catalyst layer, followed by cooling. Subsequently, the catalyst layer is removed and the graphene thin film is separated from the substrate, thereby completing the separated (formed) graphene thin film.

In the step of forming the encapsulation layer 280 by transferring the graphene thin film onto the doped graphene layer 250 after the step of forming the graphene thin film on the catalyst layer, the encapsulation layer 280 may be formed by transferring the conductive thin film 281 separated from the substrate onto the doped graphene layer 250 and annealing the same, as illustrated in FIG. 11B.

In accordance with an embodiment, in the method of manufacturing the graphene thin film, a 70 μm copper (Cu) foil, as a catalyst layer, was disposed on a substrate in a quartz tube, followed by changing the flow rate of a methane gas from 10 sccm to 30 sccm, fixing the flow rate of hydrogen gas to 10 sccm, and fixing a process pressure to 3 mTorr, so as to synthesize the graphene thin film.

Subsequently, polymethyl methacrylate (PMMA) was spin-coated on the synthesized graphene thin film. PMMA coating serves to fix the graphene thin film when the copper foil is removed using an ammonium persulfate solution.

After removing the copper foil using the ammonium persulfate solution, the ammonium persulfate solution remaining on the graphene thin film was washed with DI water, and the washed graphene thin film was transferred onto the doped graphene layer 250.

The synthesized and washed graphene thin film was transferred onto the doped graphene layer 250, and then annealed, for example, at 50° C. to 100° C. for 3 hours to 5 hours so as to remove moisture and the like.

Subsequently, to increase contact force (binding force) between the doped graphene layer 250 and the transferred graphene thin film, additional annealing was performed, for example, at 150° C. to 200° C. for three hours to four hours. As a result, the encapsulation layer 280 was formed.

The resultant encapsulation layer 280 formed on the doped graphene layer 250 encapsulates the doped graphene layer 250, thereby preventing dopants of the doped graphene layer 250 from being exposed to the air. Accordingly, the energy conversion efficiency of a solar cell may be increased.

Figure 12:
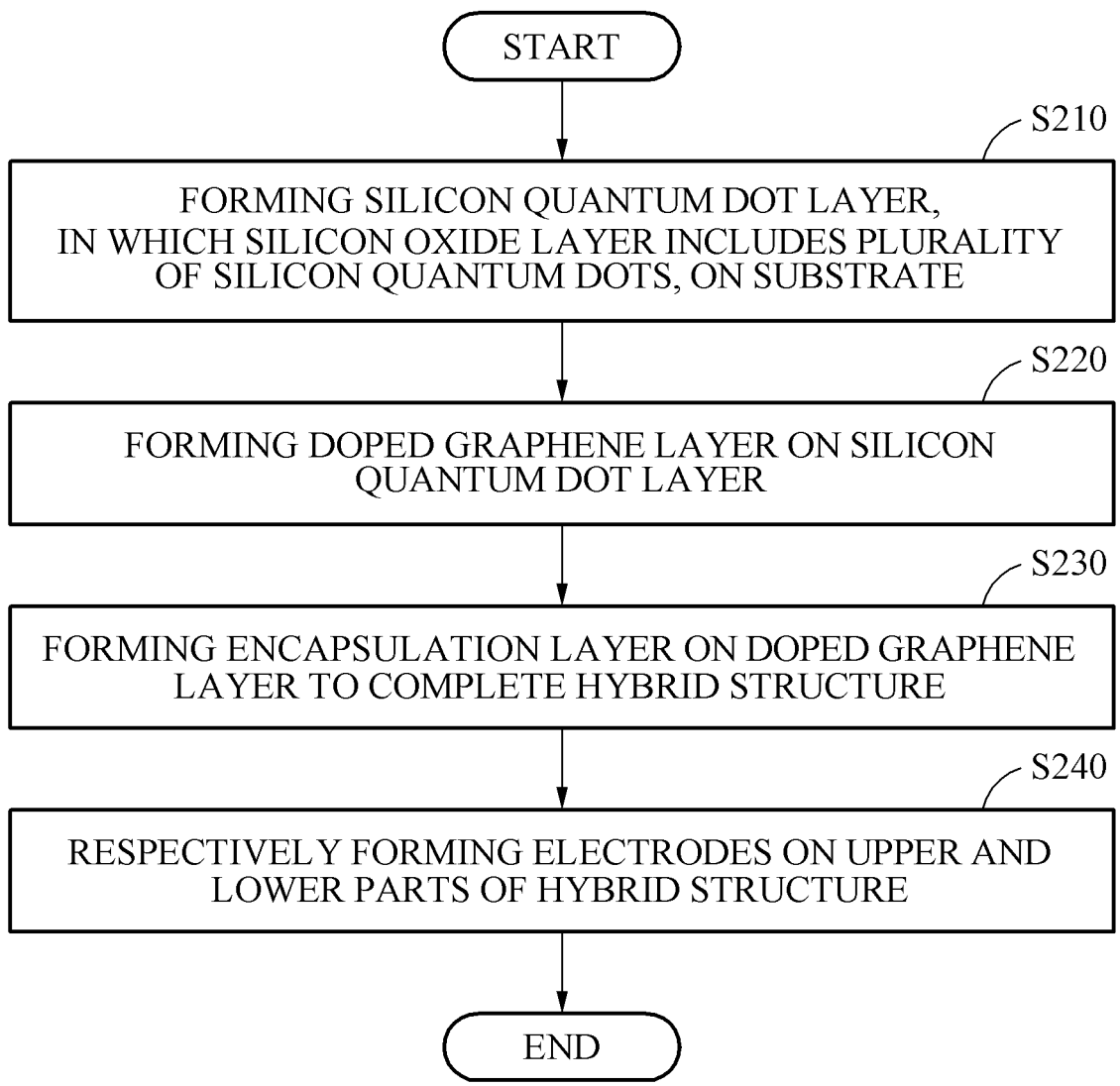
FIG. 12 illustrates a flowchart of a method of manufacturing a solar cell with a graphene-silicon quantum dot hybrid structure according to another embodiment of the present disclosure.

FIG. 12 illustrates a flowchart of the method of manufacturing a solar cell with a graphene-silicon quantum dot hybrid structure according to another embodiment of the present disclosure.

Referring to FIG. 12, in S210, the silicon quantum dot layer, in which the silicon oxide layer includes the plurality of silicon quantum dots, is formed on the substrate.

S210 may include a step of manufacturing a multi-layered sample by alternately laminating the silicon oxide ($SiO_2$) thin film and the boron (B)-doped silicon suboxide ($SiO_x$) thin film on the substrate and a step of forming the silicon quantum dot layer, in which the silicon quantum dots are uniformly distributed in the silicon oxide layer, by annealing the sample.

In S220, the doped graphene layer is formed on the silicon quantum dot layer.

S220 may include a step of forming the graphene thin film on the catalyst layer by reacting a carbon-containing mixed gas with a catalyst layer through chemical vapor deposition, a step of forming a graphene layer by transferring the formed graphene thin film onto the silicon quantum dot layer and annealing the same, and a step of forming the doped graphene layer by spin-coating a solution including $AuCl_3$ on the graphene layer and annealing the same.

In S230, an encapsulation layer is formed on the doped graphene layer, thereby completing a hybrid structure.

S230 may include a step of forming a conductive thin film on a substrate and a step of forming an encapsulation layer by transferring the conductive thin film onto the doped graphene layer.

In S240, electrodes are respectively formed on upper and lower parts of the hybrid structure.

Hereinafter, the characteristics, which are dependent upon a doping concentration of graphene, of a solar cell with a graphene-silicon quantum dot hybrid structure according to another embodiment of the present disclosure are described referring to FIG. 13.

Figure 13:
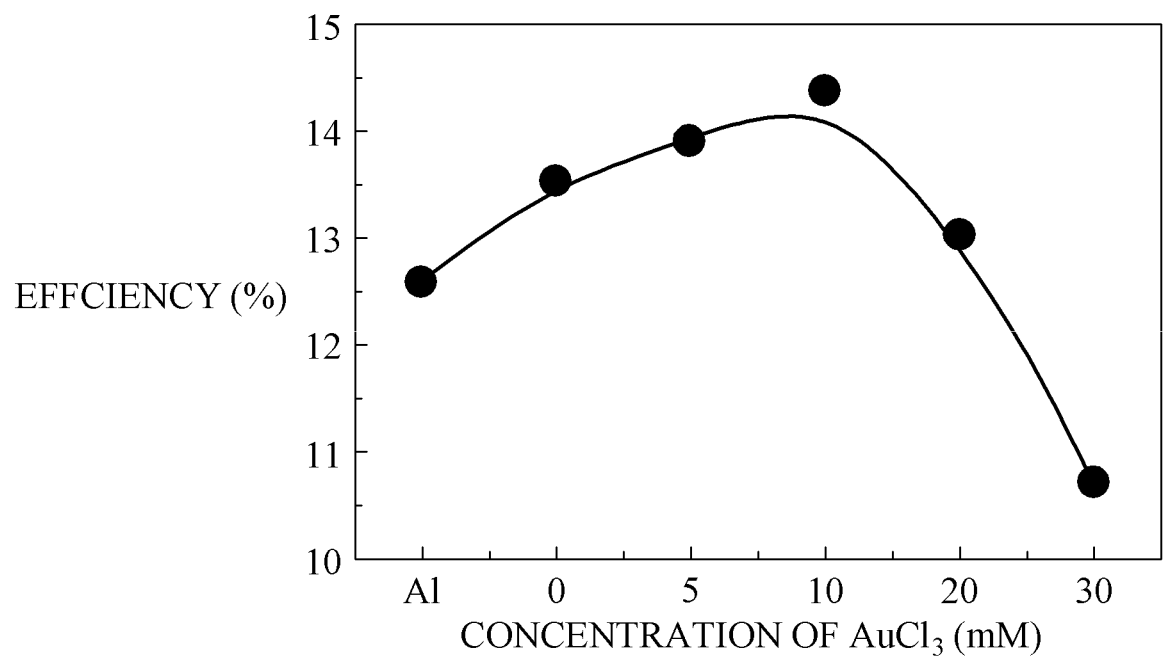
FIG. 13 illustrates a change, which is dependent upon a doping concentration of graphene, in characteristics of a solar cell with a graphene-silicon quantum dot hybrid structure (encapsulation layer-doped graphene layer-silicon quantum dot layer hybrid structure) according to another embodiment of the present disclosure.

FIG. 13 illustrates a change, which is dependent upon a doping concentration of graphene, in characteristics of a solar cell with a graphene-silicon quantum dot hybrid structure (encapsulation layer-doped graphene layer-silicon quantum dot layer hybrid structure) according to another embodiment of the present disclosure.

In particular, FIG. 13 illustrates energy conversion efficiency of a solar cell with an aluminum (Al)-silicon quantum dot hybrid structure, instead of the graphene-silicon quantum dot hybrid structure, and solar cells with a graphene-silicon quantum dot hybrid structure manufactured by varying AuCl3 doping concentration of graphene to 0 mM, 5 mM, 10 mM, 20 mM and 30 mM.

Here, the solar cell with the graphene-silicon quantum dot hybrid structure doped with $AuCl_3$ includes an encapsulation layer, which is an undoped graphene layer, on the graphene layer doped with $AuCl_3$, whereby the doped graphene layer is encapsulated by the undoped graphene layer.

Referring to Referring to FIG. 13, the energy conversion efficiency of the solar cells with the graphene-silicon quantum dot hybrid structure, doping concentrations with $AuCl_3$ of which are respectively 5 mM and 10 mM, is about 1% higher, compared to the solar cell with the aluminum (Al)-silicon quantum dot hybrid structure and the solar cell with the graphene-silicon quantum dot hybrid structure, a doping concentration with $AuCl_3$ of which is 0 mM. In addition, when a doping concentration with $AuCl_3$ is 10 mM, the energy conversion efficiency is 14.38%.

Comparing FIG. 13 with FIG. 8, it can be confirmed that, when the doped graphene layer encapsulated with the undoped graphene layer (encapsulation layer) is used, efficiency is higher than the case in which the encapsulation layer is not used. This result occurs because exposure of dopants to the air is prevented due to application of the encapsulation method using an encapsulation layer.

In addition, it can be predicted that, from the band structure of the solar cell with the graphene-silicon quantum dot hybrid structure (see FIG. 9B), the work function increases when the graphene layer is subjected to p-type doping, and thus, an energy barrier at a graphene-silicon quantum dot interface is lowered. Accordingly, collection of holes is facilitated, thereby increasing the efficiency of a solar cell. FIG. 13 proves such logic. That is, a result apparently different from the case of FIG. 8, in which the encapsulation layer is not included, is observed.

Meanwhile, referring to FIG. 13, it can be confirmed that, when an $AuCl_3$ doping concentration of the graphene layer is higher than 10 mM, efficiency is decreased. This result occurs because the transmittance of the graphene layer is decreased with increasing doping concentration of $AuCl_3$, and thus, light is not satisfactorily absorbed.

A solar cell with the graphene-silicon quantum dot hybrid structure including the silicon quantum dot layer, the doped graphene layer, and the encapsulation layer has been described above referring to FIGS. 10 to 13.

Hereinafter, a solar cell with a graphene-silicon quantum dot hybrid structure including a silicon quantum dot layer, a graphene layer, and a metal nanowire layer is described referring to FIGS. 14 to 16.

Figure 14:
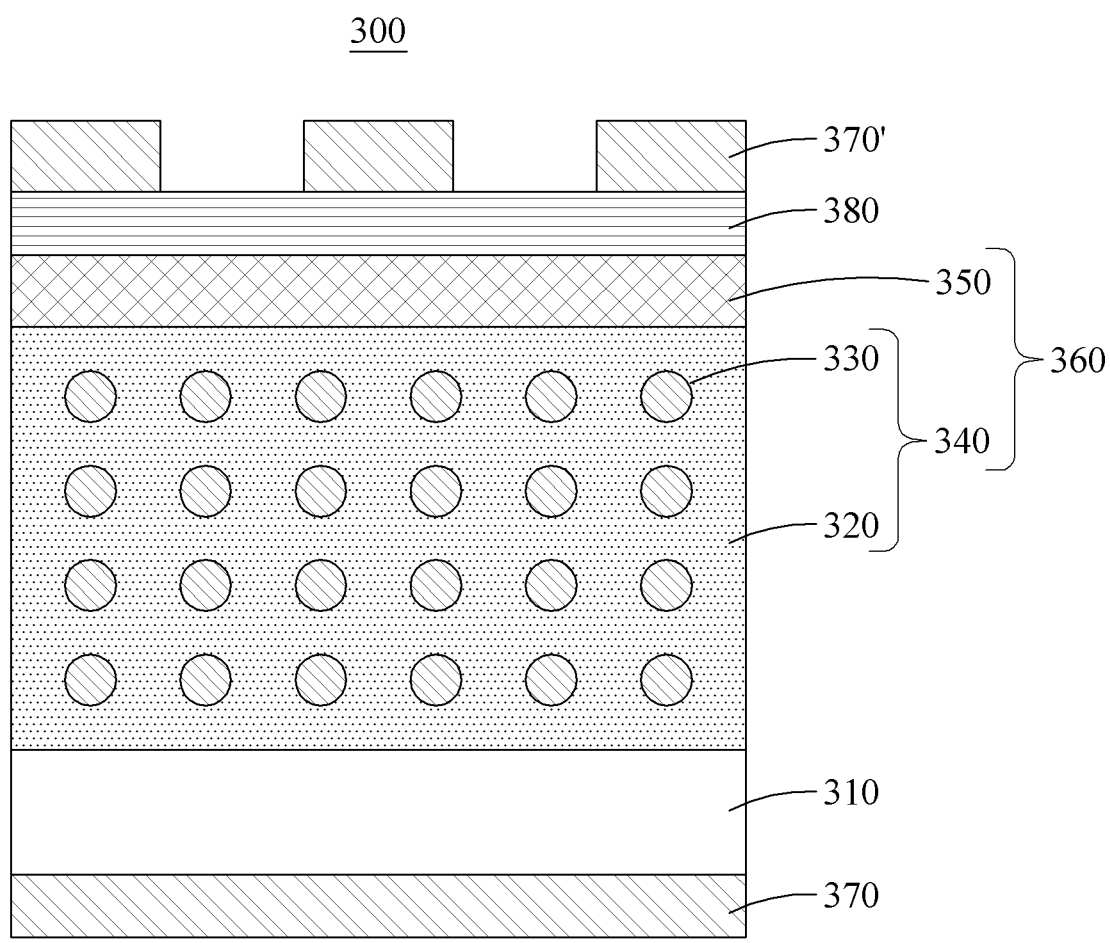
FIG. 14 illustrates a sectional view of a solar cell with a graphene-silicon quantum dot hybrid structure according to another embodiment of the present disclosure.

FIG. 14 illustrates a sectional view of a solar cell with a graphene-silicon quantum dot hybrid structure according to another embodiment of the present disclosure.

Referring to FIG. 14, a solar cell 300 with a graphene-silicon quantum dot hybrid structure according to another embodiment of the present disclosure includes a hybrid structure 360 constituted of a silicon quantum dot layer 340, in graphene layer 350 formed on the silicon quantum dot layer 340, and an metal nanowire layer 380 formed on the graphene layer 350; and electrodes 370 and 370' formed on upper and lower parts of the hybrid structure 360.

The solar cell 300 with the graphene-silicon quantum dot hybrid structure may further include a substrate 310. In the solar cell 300 with the graphene-silicon quantum dot hybrid structure, the hybrid structure 360 may be formed on the substrate 310, and the electrodes 370 and 370' may be respectively formed on upper and lower parts of the hybrid structure 360.

In particular, the hybrid structure 360 of the solar cell 300 includes the silicon quantum dot layer 340, the graphene layer 350, and the metal nanowire layer 380. Here, the constituents of the silicon quantum dot layer 340 may be the same as those of the solar cell 100 with the graphene-silicon quantum dot hybrid structure according to an embodiment of the present disclosure, and thus, descriptions thereof are omitted.

The solar cell 300 with the graphene-silicon quantum dot hybrid structure according to another embodiment of the present disclosure includes the graphene layer 350.

Here, the graphene layer 350 refers to an undoped (pristine) graphene layer unlike the aforementioned doped graphene layers 150 and 250 (see FIGS. 1 and 10).

The graphene layer 350 may be a graphene thin film deposited, through chemical vapor deposition, on the catalyst layer by reacting a catalyst layer with a carbon-containing mixed gas.

In particular, a step of forming the graphene layer 350 may include a step of forming the graphene thin film on the catalyst layer by reacting a carbon-containing mixed gas with a catalyst layer and a step of forming the graphene layer 350 by transferring the formed graphene thin film onto the silicon quantum dot layer 340 and annealing the same (see FIGS. 2C and 2D).

In accordance with an embodiment, in the step of forming the graphene thin film on the catalyst layer by reacting a carbon-containing mixed gas with a catalyst layer through chemical vapor deposition, the graphene thin film may be formed by a crystallized graphene structure of carbon atoms, which are included in the catalyst layer, formed on a surface of the catalyst layer through deposition of a metal (e.g., copper or nickel), which is utilized as a catalyst layer, on the substrate, and reaction of a mixed gas of methane and hydrogen with the catalyst layer at high temperature such that a proper amount of carbon is dissolved in or adsorbed to the catalyst layer, followed by cooling. Subsequently, the catalyst layer is removed and the graphene thin film is separated from the substrate, thereby completing the separated (formed) graphene thin film.

After the step of forming the graphene thin film on the catalyst layer, the graphene layer 350 may be formed by transferring the formed graphene thin film onto the silicon quantum dot layer 340.

For example, in the method of manufacturing the graphene thin film, a 70 μm copper (Cu) foil, as a catalyst layer, was disposed on a substrate in a quartz tube, followed by changing the flow rate of a methane gas from 10 sccm to 30 sccm, fixing the flow rate of hydrogen gas to 10 sccm, and fixing a process pressure to 3 mTorr, so as to synthesize the graphene thin film.

Subsequently, polymethyl methacrylate (PMMA) was spin-coated on the synthesized graphene thin film. PMMA coating serves to fix the graphene thin film when the copper foil is removed using an ammonium persulfate solution.

After removing the copper foil using the ammonium persulfate solution, the ammonium persulfate solution remaining on the graphene thin film was washed with DI water, and the washed graphene thin film was transferred onto the silicon quantum dot layer 340.

The synthesized and washed graphene thin film was transferred onto the silicon quantum dot layer 340, and then annealed, for example, at 50° C. to 100° C. for 3 hours to 5 hours so as to remove moisture and the like.

Subsequently, to increase contact force (binding force) between the silicon quantum dot layer 340 and the transferred graphene thin film, additional annealing was performed, for example, at 150° C. to 200° C. for three hours to four hours. As a result, the graphene layer 350 was formed.

The solar cell with the graphene-silicon quantum dot hybrid structure according to another embodiment of the present disclosure includes the metal nanowire layer 380.

The metal nanowire layer 380 is formed on the graphene layer 350, thereby decreasing the sheet resistance of the graphene layer 350. Accordingly, electrical conductivity may be improved and thus the energy conversion efficiency of a solar cell may be increased.

In particular, the metal nanowire layer 380 lowers reflectivity of the light so that more light enters a solar cell. In addition, the metal nanowire layer 380 greatly increases the electrical conductivity of the graphene layer 350 (or greatly decreases sheet resistance), so that the flow of electrons or holes is facilitated and thus more electrons and holes are recombined in each electrode. Accordingly, the energy conversion efficiency of a solar cell may be increased.

The metal nanowire layer 380 may be formed of, for example, a metal nanowire material such as silver (Au), copper (Cu), nickel (Ni), aluminum (Al), manganese (Mn), titanium (Ti), vanadium (V), tungsten (W), or gold (Au).

The metal nanowire layer 380 may be formed of, particularly, nanowires (AgNW, Ag nanowires).

The metal nanowire layer 380 may be formed by coating a metal nanowire solution on the graphene layer 350.

In accordance with an embodiment, 0.5% by weight of a nanowire solution (AgNW solution) was mixed with isopropyl alcohol (IPA). A resultant mixture was diluted to nanowire solutions at various concentrations such that the content of silver nanowires is 0.05% by weight, 0.08% by weight, 0.1% by weight, 0.2% by weight, 0.25% by weight, and 0.3% by weight.

Subsequently, each of the silver nanowire solutions was spin-coated onto the graphene layer 350 at 2,500 rpm for one minute, followed by annealing, for example, at 50° C. to 200° C. for one to five hours. As a result, the metal nanowire layer 380 was formed.

When the metal nanowire layer 380 is formed on the graphene layer 350 like this, reflectivity of the light is lowered and thus more light enters a solar cell. In addition, the metal nanowire layer 380 greatly increases the electrical conductivity of the graphene layer 350 (or greatly decreases sheet resistance), so that the flow of electrons or holes is facilitated and thus more electrons and holes are recombined in each electrode. Accordingly, the energy conversion efficiency of a solar cell may be increased.

Figure 15:
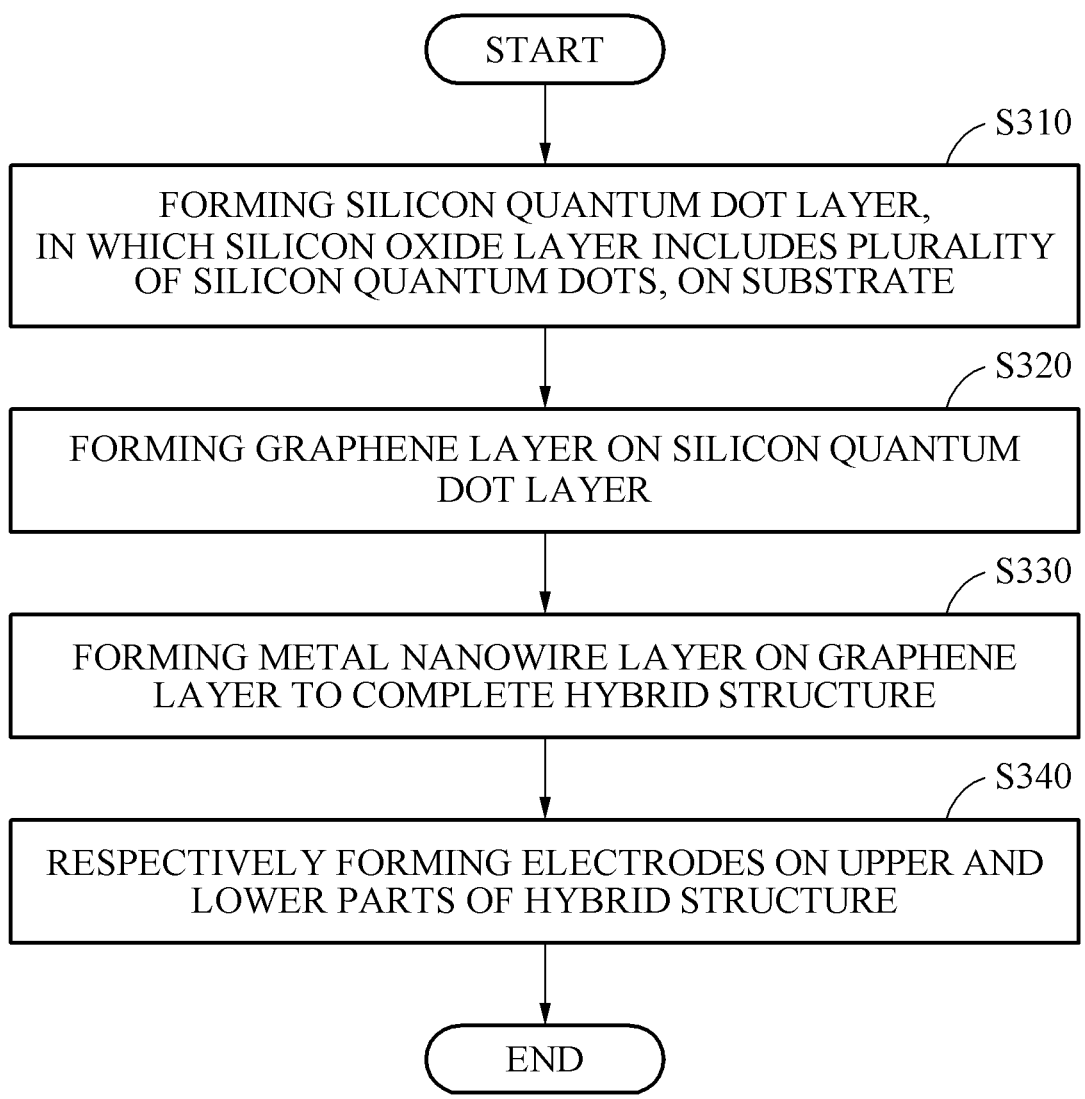
FIG. 15 illustrates a flowchart of a method of manufacturing a solar cell with a graphene-silicon quantum dot hybrid structure according to another embodiment of the present disclosure.

FIG. 15 illustrates a flowchart of a method of manufacturing a solar cell with a graphene-silicon quantum dot hybrid structure according to another embodiment of the present disclosure.

Referring to FIG. 15, in S310, the silicon quantum dot layer, in which the silicon oxide layer includes the plurality of silicon quantum dots, is formed on the substrate.

S310 may include a step of manufacturing a multi-layered sample by alternately laminating the silicon oxide ($SiO_2$) thin film and the boron (B)-doped silicon suboxide ($SiO_x$) thin film on the substrate and a step of forming the silicon quantum dot layer, in which the silicon quantum dots are uniformly distributed in the silicon oxide layer, by annealing the sample.

In S320, the graphene layer is formed on the silicon quantum dot layer.

S320 may include a step of forming the graphene thin film on the catalyst layer by reacting a carbon-containing mixed gas with a catalyst layer through chemical vapor deposition, and a step of forming a graphene layer by transferring the formed graphene thin film onto the silicon quantum dot layer and annealing the same.

In S330, the metal nanowire layer is formed on the graphene layer, thereby completing the hybrid structure.

S330 may include a step of forming a metal nanowire layer by coating a metal nanowire solution on the graphene layer.

In S340, electrodes are respectively formed on upper and lower parts of the hybrid structure.

Hereinafter, the characteristics, which are dependent upon a doping concentration with graphene, a solar cell with a graphene-silicon quantum dot hybrid structure according to another embodiment of the present disclosure are described referring to FIG. 16.

Figure 16:
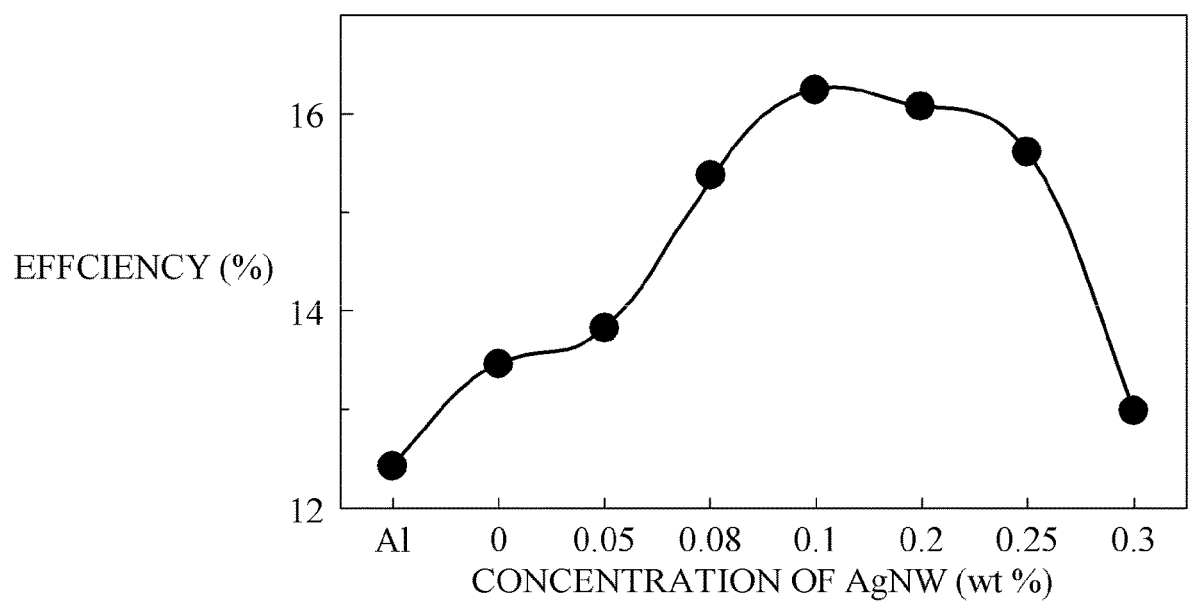
FIG. 16 illustrates a change, which is dependent upon the concentration of a metal nanowire layer, in characteristics of a solar cell with a graphene-silicon quantum dot hybrid structure (metal nanowire layer-graphene layer-silicon quantum dot layer hybrid structure) according to another embodiment of the present disclosure.

FIG. 16 illustrates a change, which is dependent upon the concentration of a metal nanowire layer, in characteristics of a solar cell with a graphene-silicon quantum dot hybrid structure (metal nanowire layer-graphene layer-silicon quantum dot layer hybrid structure) according to another embodiment of the present disclosure.

In particular, FIG. 16 illustrates energy conversion efficiencies of a solar cell having an aluminum (Al)-silicon quantum dot hybrid structure instead of the graphene-silicon quantum dot hybrid structure, and solar cells with a graphene-silicon quantum dot hybrid structure manufactured by varying the concentration of nanowires (AgNW) on a graphene layer to 0% by weight, 0.05% by weight, 0.08% by weight, 0.1% by weight, 0.2% by weight, 0.25% by weight, and 0.3% by weight. Here, when the concentration of silver nanowires (AgNW) is 0% by weight, a silver nanowire layer is not formed.

Referring to FIG. 16, it can be confirmed that the energy conversion efficiencies of the solar cells with the graphene-silicon quantum dot hybrid structure wherein the concentrations of nanowires (AgNW) are respectively 0.05% by weight, 0.08% by weight, 0.1% by weight, 0.2% by weight, and 0.25% by weight are about 3% higher are improved, compared to the solar cell with the aluminum (Al)-silicon quantum dot hybrid structure and the solar cell with the graphene-silicon quantum dot hybrid structure wherein the concentration of nanowires (AgNW) is 0% by weight.

That is, it can be confirmed that the energy conversion efficiency of the solar cell with the silver nanowire layer-graphene layer-silicon quantum dot layer hybrid structure is superior to that of the solar cell with the graphene layer-silicon quantum dot layer hybrid structure.

In addition, it can be confirmed from experimental results at various silver nanowire concentrations that when the concentration of silver nanowires is 0.1% by weight, a maximum efficiency of 16.06% is exhibited, which indicates the best solar cell characteristic.

Meanwhile, when graphene is doped with silver nanowires, graphene is n-doped, and thus, energy barrier at a graphene-silicon quantum dot interface increases (see FIG. 9B), which may negatively affect solar cell efficiency. However, through work function measurement, such negative effect was determined to be very small, compared to p-type doping effect due to $AuCl_3$.

On the other hand, silver nanowires lower reflectivity of the light so that more light enters a solar cell. In addition, the silver nanowires greatly increase the electrical conductivity of the graphene layer 350 (or greatly decreases sheet resistance), so that the flow of electrons or holes is facilitated and thus more electrons and holes are recombined in each electrode. Accordingly, the energy conversion efficiency of a solar cell may be increased.

Accordingly, since the latter case dominates the case of the former case, the efficiency of the solar cell increases up to 0.1%. However, when the concentration of silver nanowires is higher than 0.1%, transmittance is rapidly decreased and, as illustrated in FIG. 16, the efficiency is decreased again.

As apparent from the above description, according to an embodiment of the present disclosure, a solar cell with a hybrid structure including a silicon quantum dot layer and a doped graphene layer may be manufactured.

In addition, according to an embodiment of the present disclosure, a solar cell with a graphene-silicon quantum dot hybrid structure having improved electrical characteristics may be manufactured by controlling a doping concentration of graphene.

In addition, according to an embodiment of the present disclosure, a solar cell with a graphene-silicon quantum dot hybrid structure having increased stability and energy conversion efficiency may be manufactured by annealing a solar cell.

In addition, according to an embodiment of the present disclosure, a solar cell with a hybrid structure having increased energy conversion efficiency may be manufactured due to inclusion of a silicon quantum dot layer, doped graphene layer, and encapsulation layer.

Further, according to an embodiment of the present disclosure, a solar cell with a hybrid structure having increased energy conversion efficiency may be manufactured due to inclusion of a silicon quantum dot layer, a graphene layer, and a metal nanowire layer.

Although the present disclosure has been described through limited examples and figures, the present disclosure is not intended to be limited to the examples. Those skilled in the art will appreciate that various modifications, additions and substitutions are possible, without departing from the scope and spirit of the disclosure. It should be understood that there is no intent to limit the disclosure to the embodiments disclosed, rather, the disclosure is to cover all modifications, equivalents, and alternatives falling within the spirit and scope of the disclosure as defined by the claims.

What is claimed is:

1. A solar cell with a graphene-silicon quantum dot hybrid structure, comprising:
   a hybrid structure comprising a silicon quantum dot layer including a silicon oxide layer and a plurality of silicon quantum dots formed in the silicon oxide layer; a doped graphene layer formed on the silicon quantum dot layer, and an encapsulation layer formed on the doped graphene layer and encapsulating the doped graphene layer; and
   electrodes formed on upper and lower parts of the hybrid structure,
   wherein the doped graphene layer is doped with $AuCl_3$ having a doping concentration of from 5 mM to 10 mM,
   wherein the encapsulation layer prevents dopants in the doped graphene layer from being exposed to air, increasing energy conversion efficiency, and wherein the encapsulation layer is formed of an undoped graphene.

2. The solar cell according to claim 1, wherein the hybrid structure and the electrodes are subjected to annealing.

3. The solar cell according to claim 2, wherein the annealing is performed at 450° C. to 550° C.

4. The solar cell according to claim 1, wherein the doped graphene layer has a sheet resistance of 150 ohm/sq to 500 ohm/sq.

* * * * *